(12) United States Patent
Yang et al.

(10) Patent No.: US 12,369,503 B2
(45) Date of Patent: Jul. 22, 2025

(54) ENCAPSULATED PHASE CHANGE MATERIAL SWITCH AND METHODS FOR FORMING THE SAME

(71) Applicant: Taiwan Semiconductor Manufacturing Company Limited, Hsinchu (TW)

(72) Inventors: Tsung-Hsueh Yang, Taichung (TW); Chang-Chih Huang, Taichung (TW); Fu-Ting Sung, Yangmei (TW); Kuo-Chyuan Tzeng, Chu-Pei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 468 days.

(21) Appl. No.: 17/826,815

(22) Filed: May 27, 2022

(65) Prior Publication Data
US 2023/0389449 A1 Nov. 30, 2023

(51) Int. Cl.
*H10N 70/20* (2023.01)
*H10B 63/00* (2023.01)
*H10N 70/00* (2023.01)

(52) U.S. Cl.
CPC .......... *H10N 70/231* (2023.02); *H10B 63/30* (2023.02); *H10N 70/021* (2023.02); *H10N 70/063* (2023.02); *H10N 70/066* (2023.02); *H10N 70/8413* (2023.02)

(58) Field of Classification Search
CPC ..................................... H10N 70/231
See application file for complete search history.

(56) References Cited

U.S. PATENT DOCUMENTS

| | | | | |
|---|---|---|---|---|
| 2012/0112788 A1* | 5/2012 | Lung | ............... | G11C 17/165 326/39 |
| 2022/0407004 A1* | 12/2022 | Heiss | ............... | H01L 23/66 |
| 2023/0075622 A1* | 3/2023 | Ok | ............... | H10N 70/066 |

* cited by examiner

*Primary Examiner* — Mounir S Amer
(74) *Attorney, Agent, or Firm* — The Marbury Law Group, PLLC

(57) ABSTRACT

A dielectric isolation layer having a planar top surface is formed over a substrate. A first electrode and a second electrode are formed over the planar top surface. An insulating matrix layer is formed around the first electrode and the second electrode. A phase change material (PCM) line is formed over the insulating matrix layer. A first end portion of the PCM line contacts a top surface of the first electrode and a second end portion of the PCM line contacts a top surface of the second electrode. A dielectric encapsulation layer is formed on sidewalls of the PCM line and over the PCM line and over a top surface of the insulating matrix layer. A heater line is formed prior to, or after, formation of the PCM line. The heater line underlies the PCM line or overlies the PCM line. A PCM switch device may be provided.

20 Claims, 32 Drawing Sheets

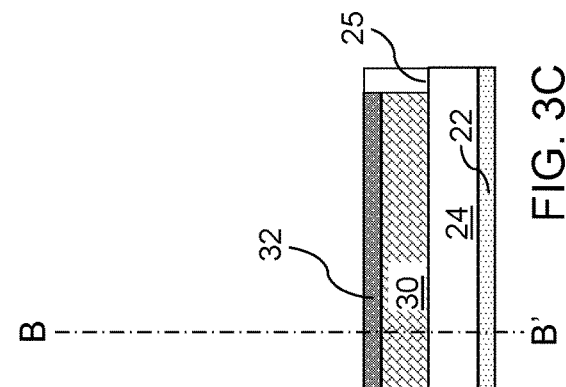
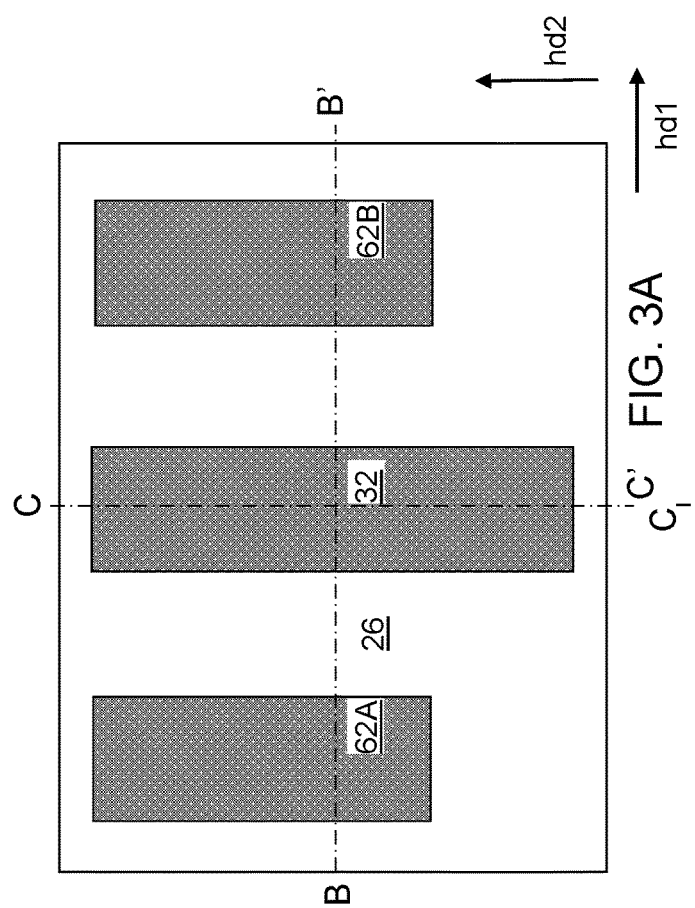
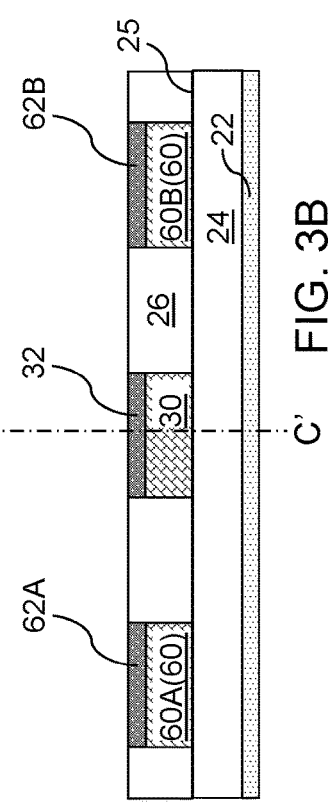

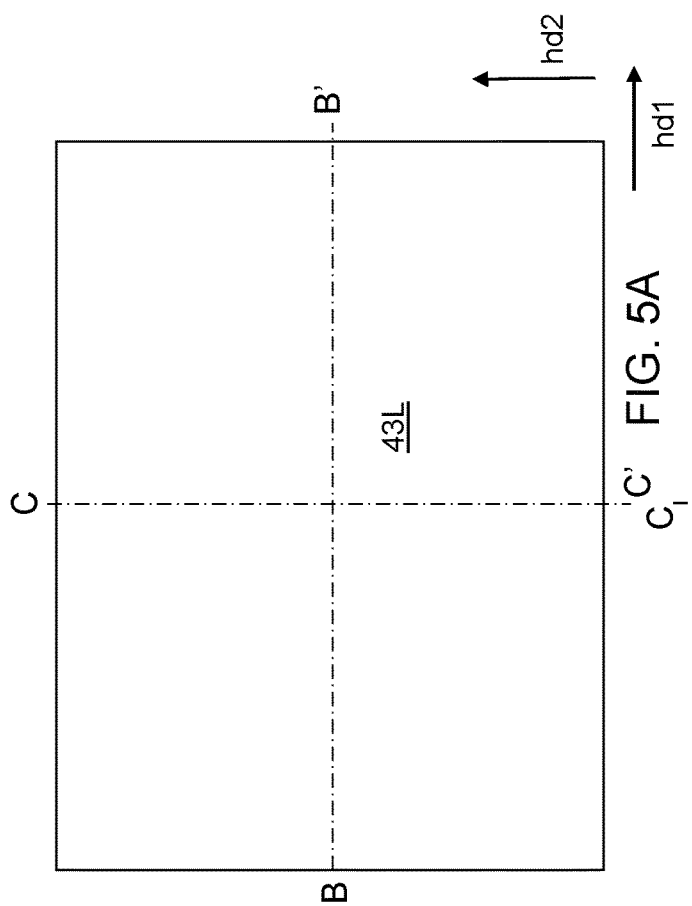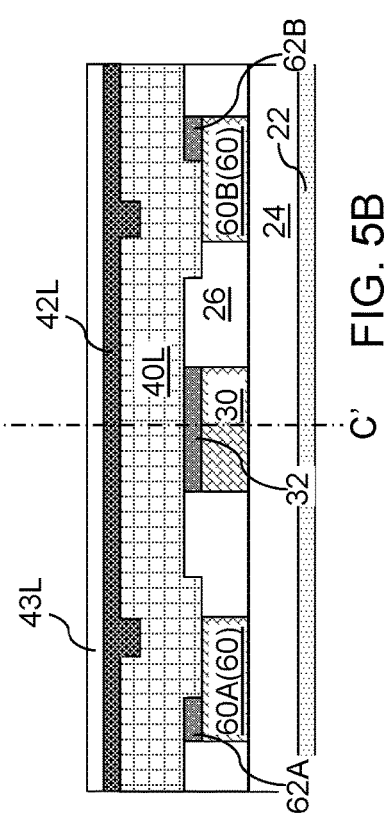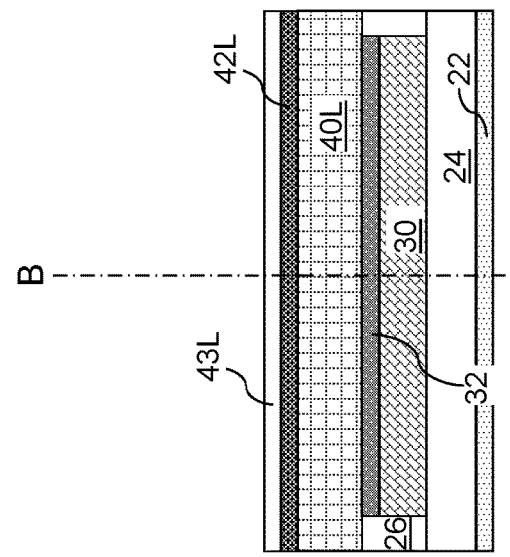

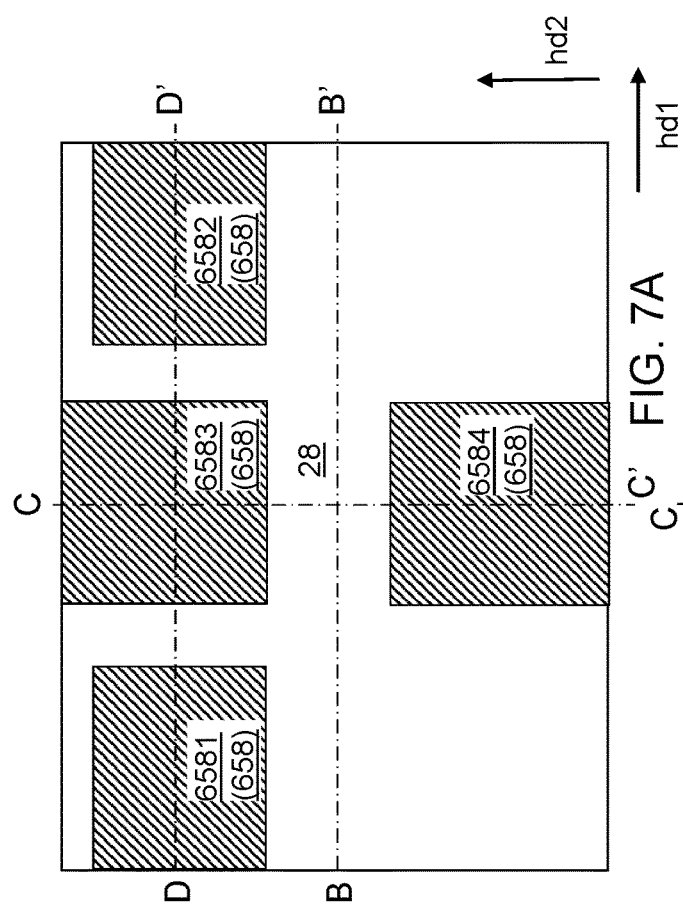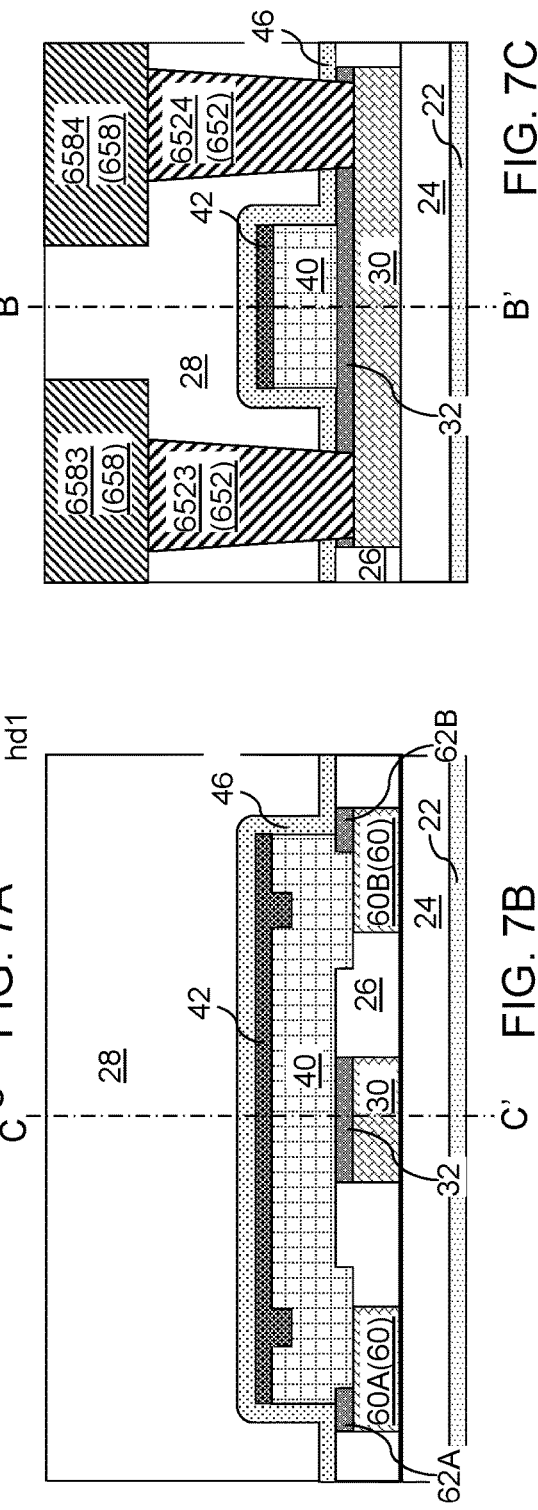

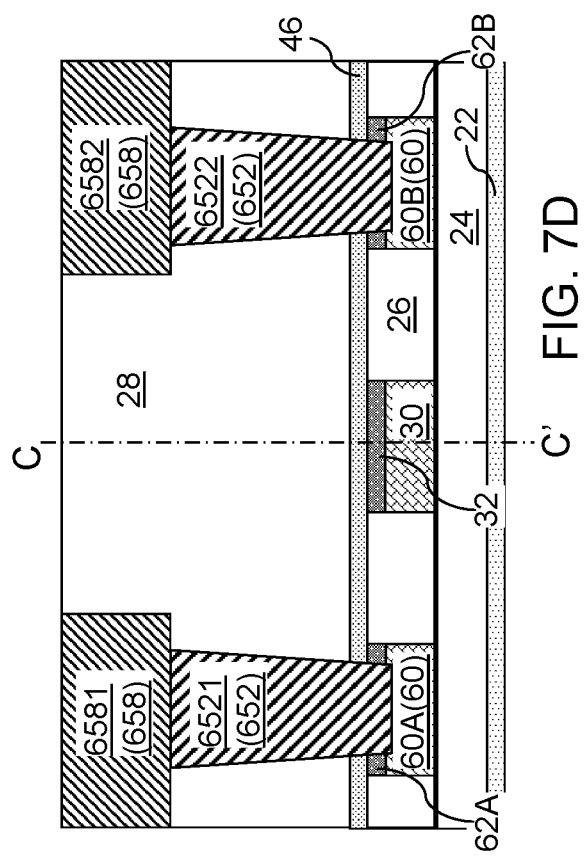

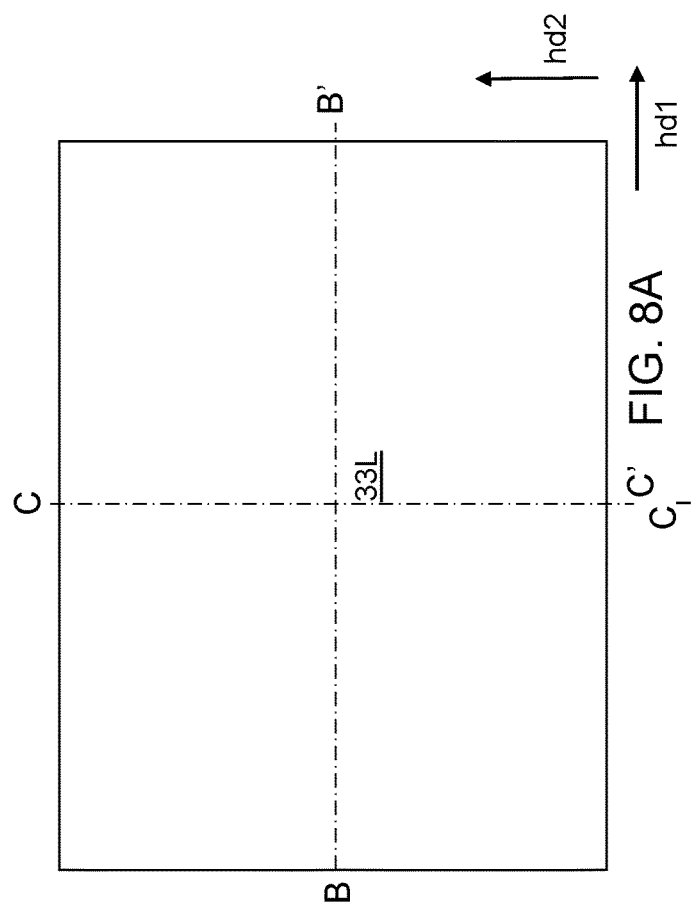
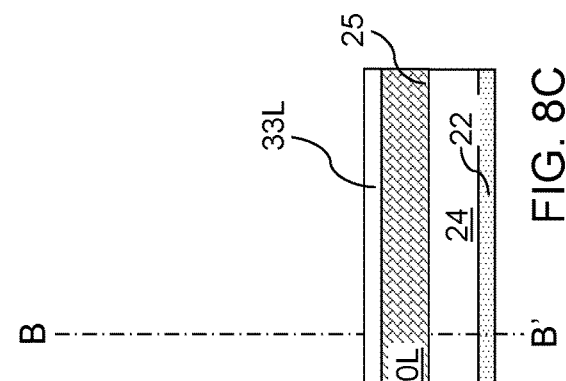
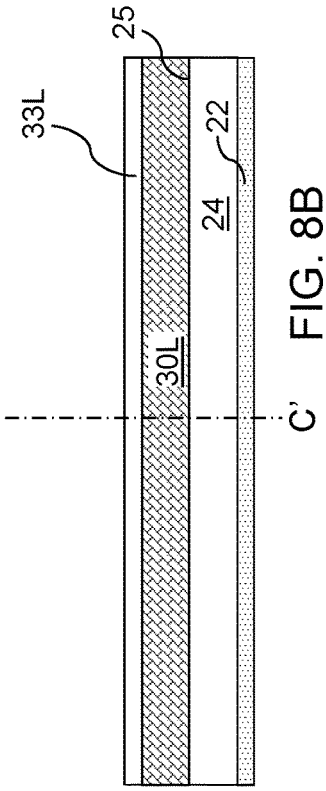

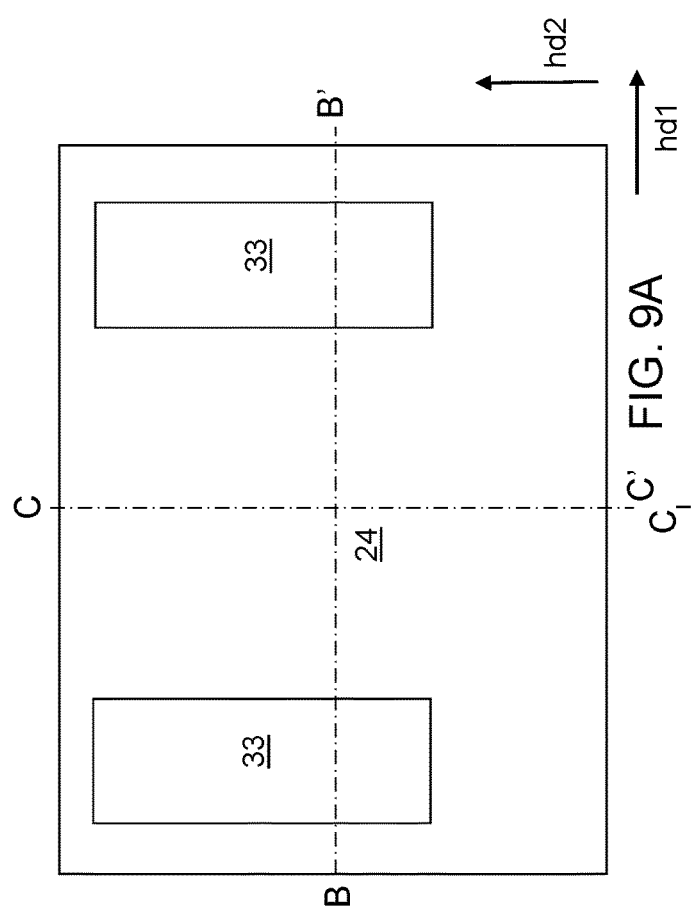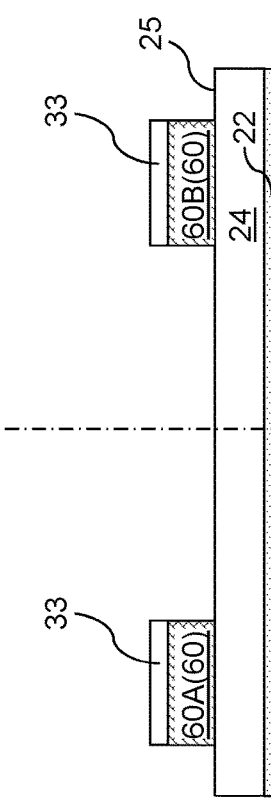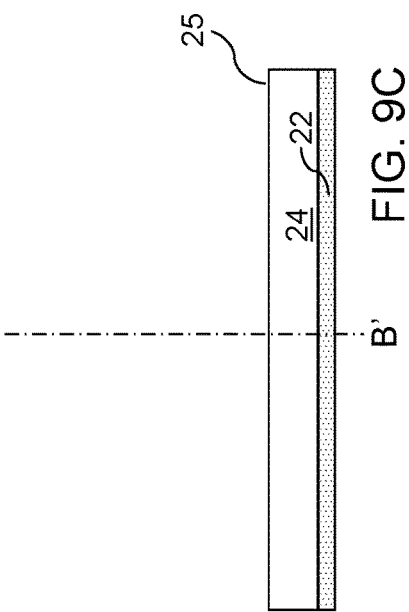

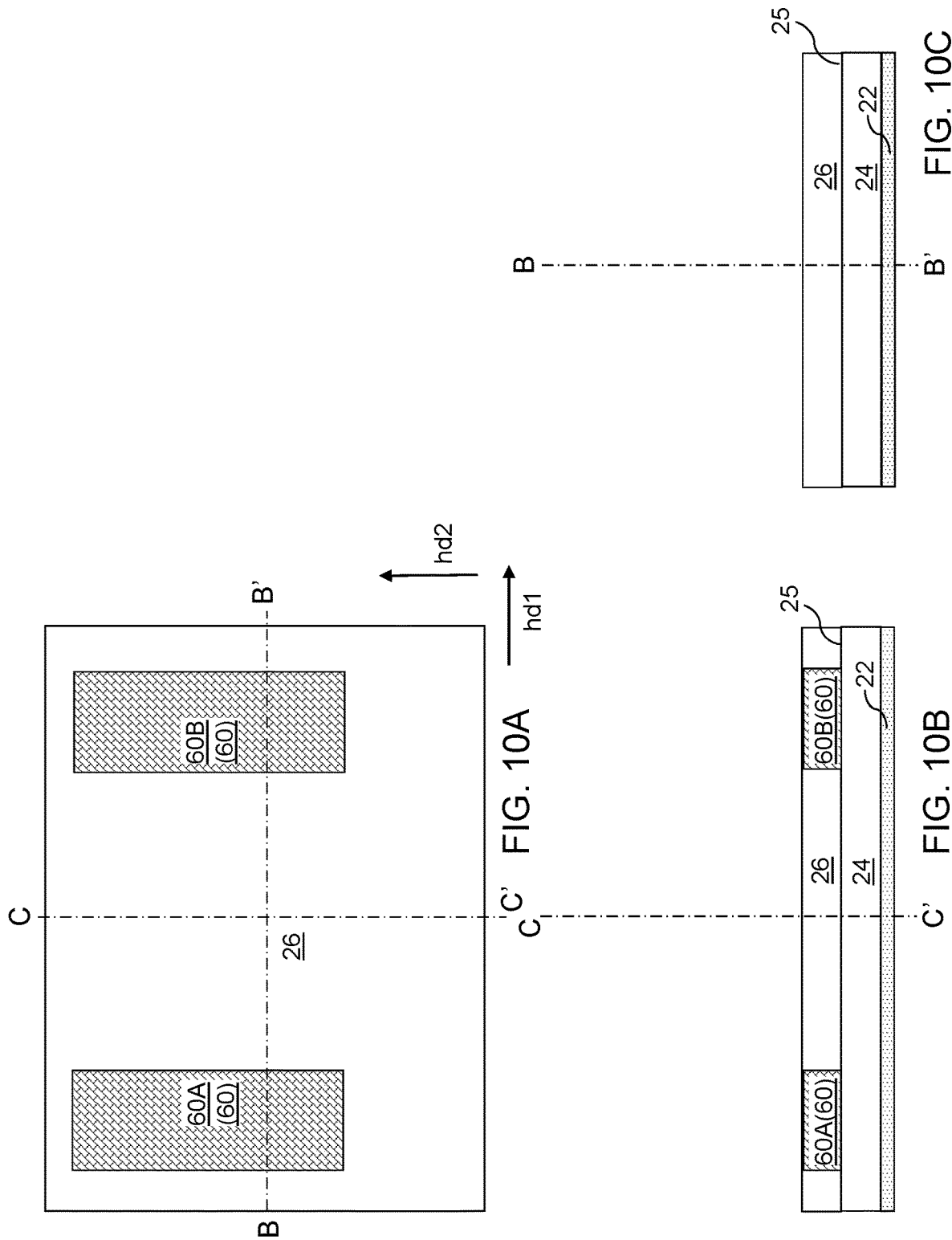

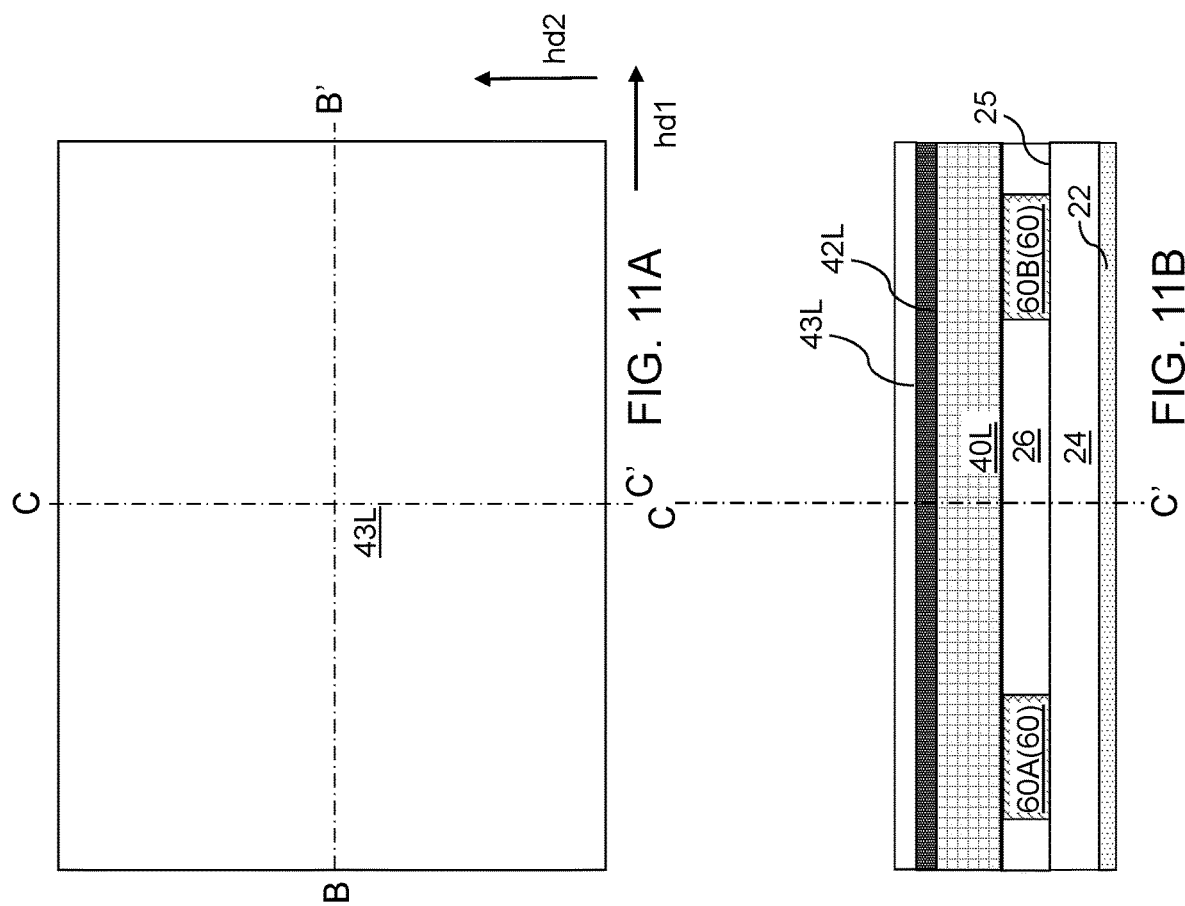

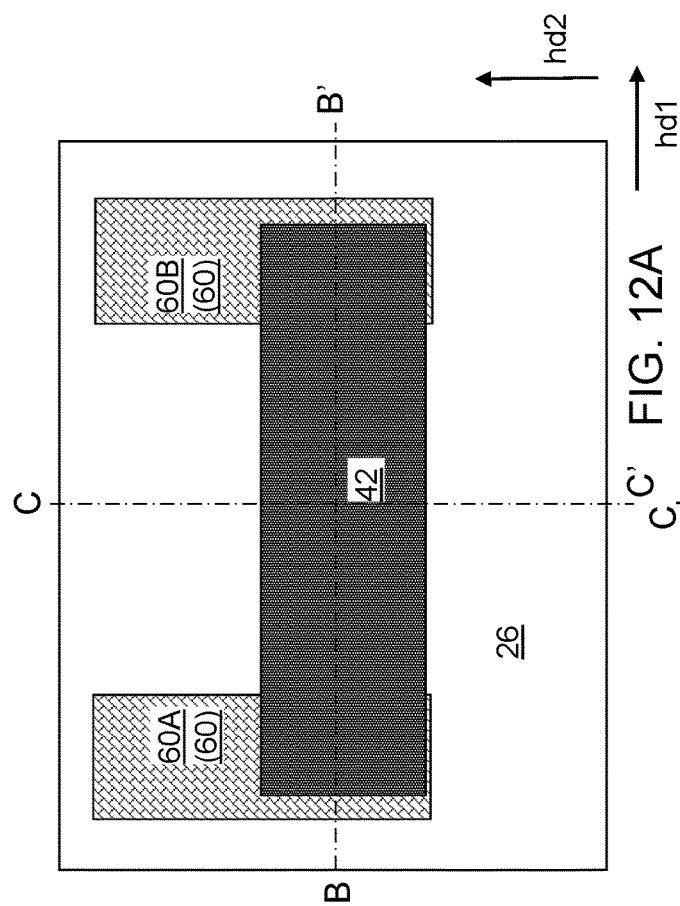
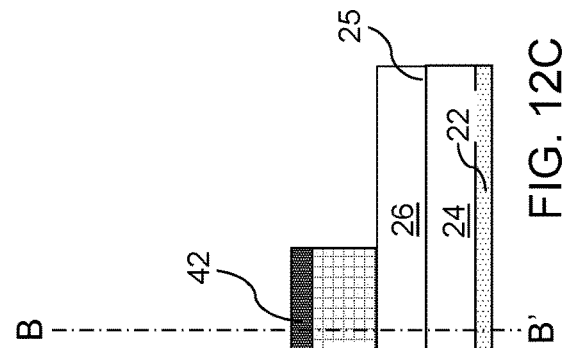
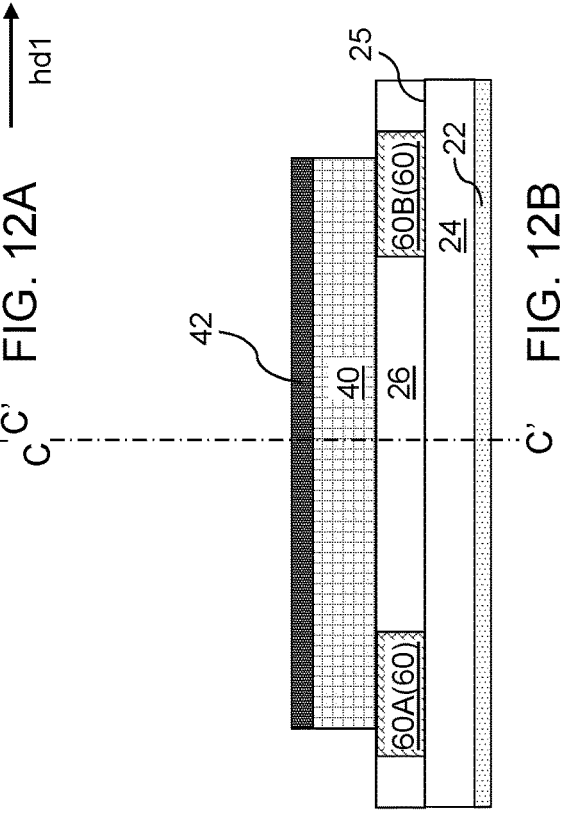
FIG. 12A
FIG. 12B
FIG. 12C

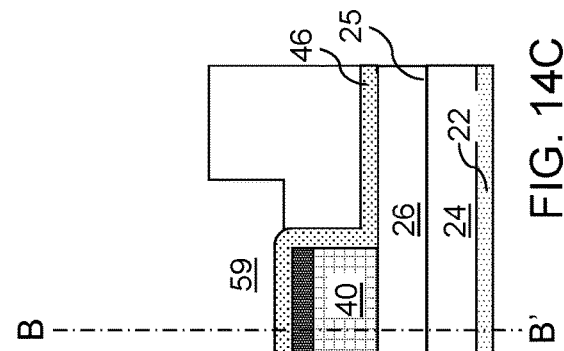
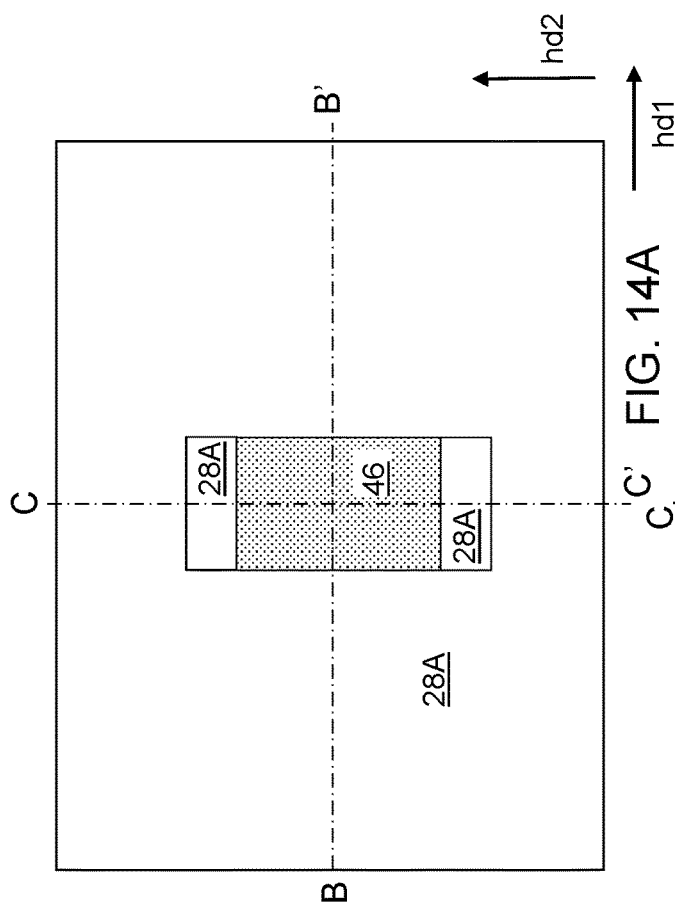
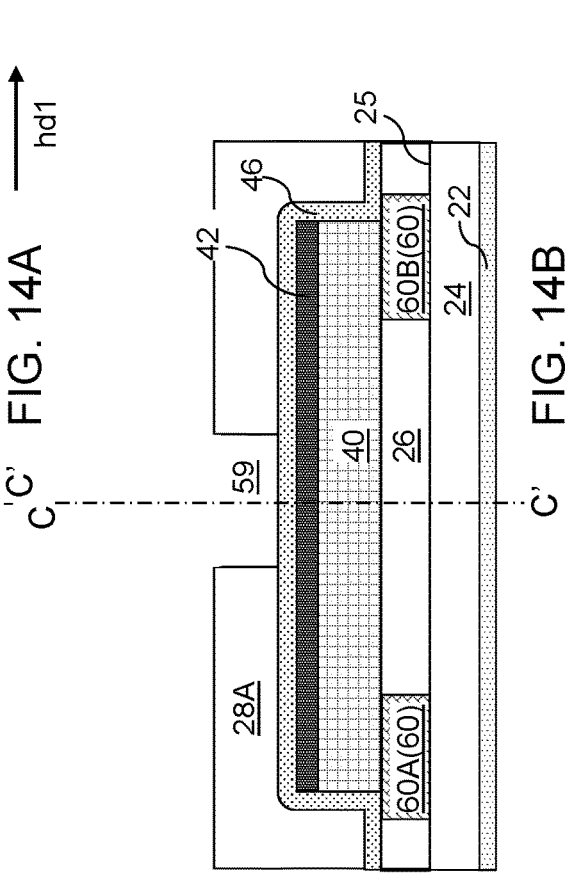

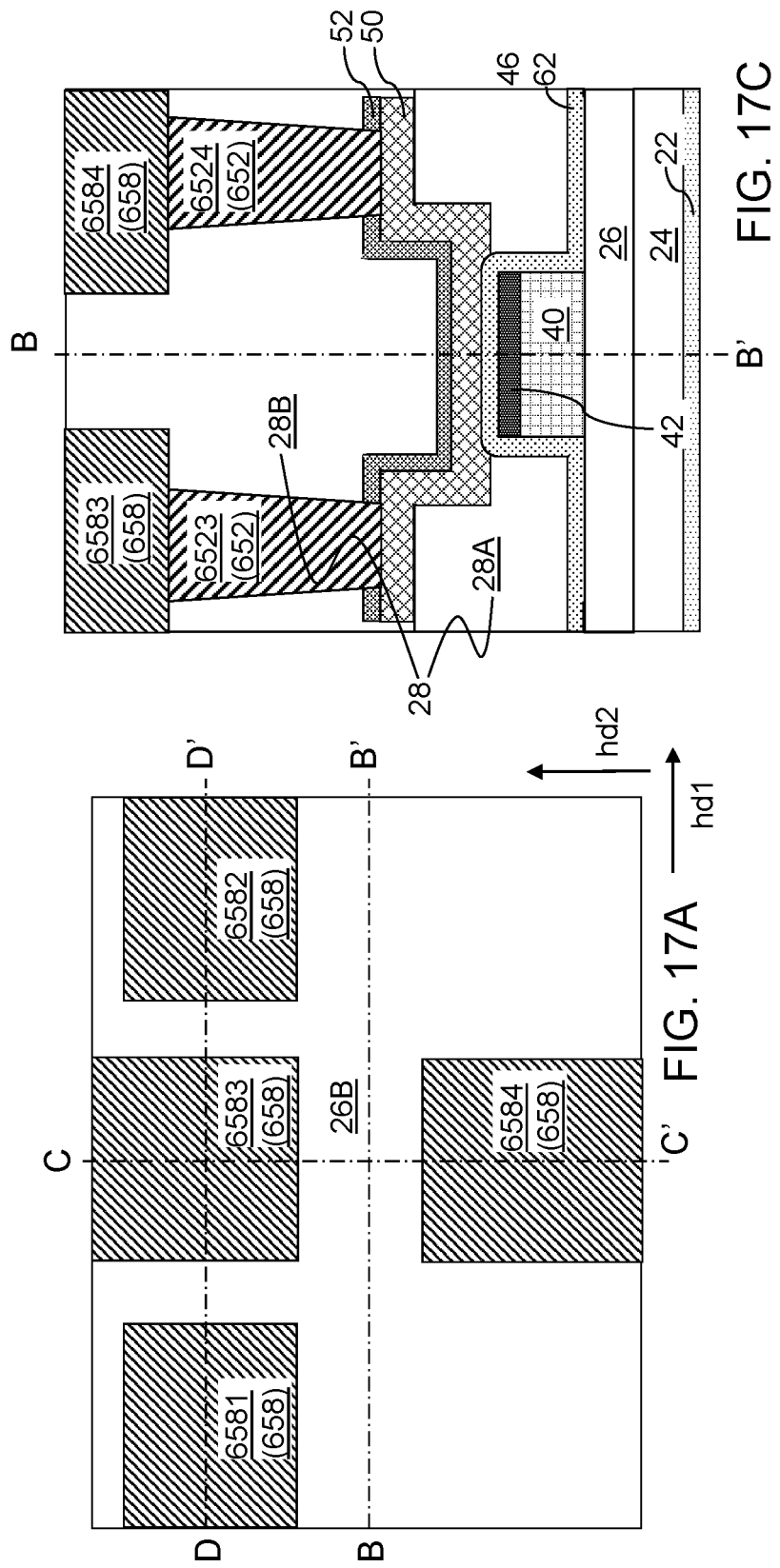

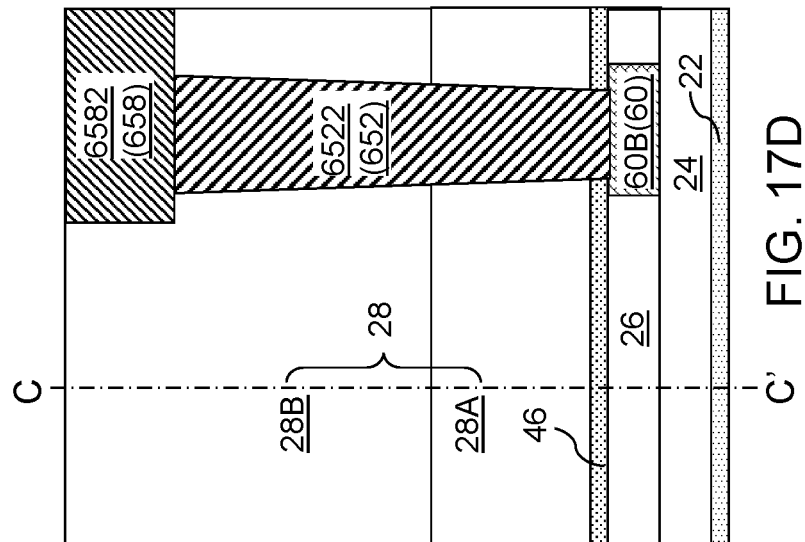
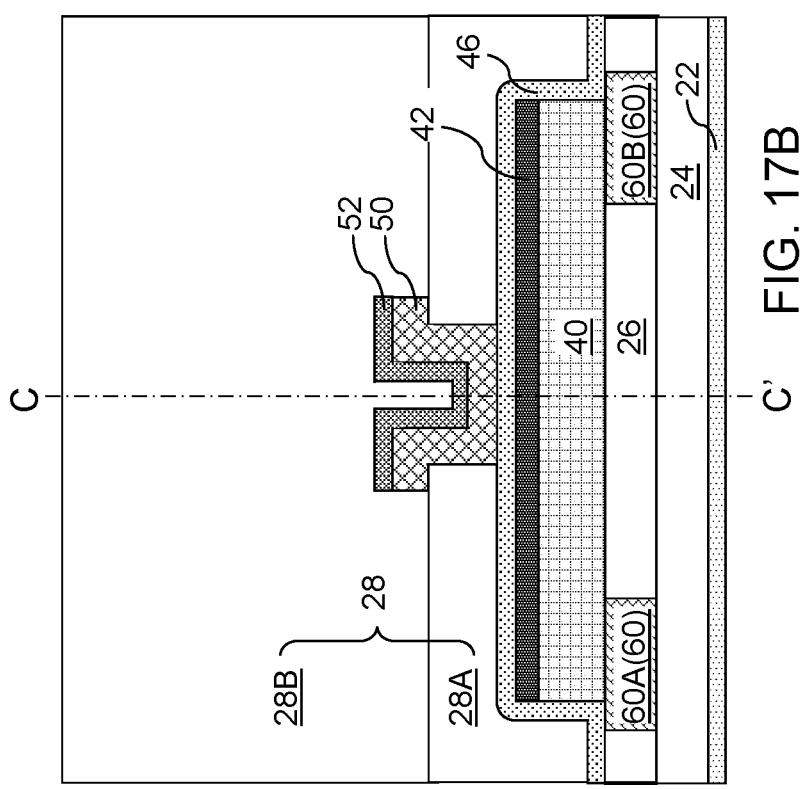

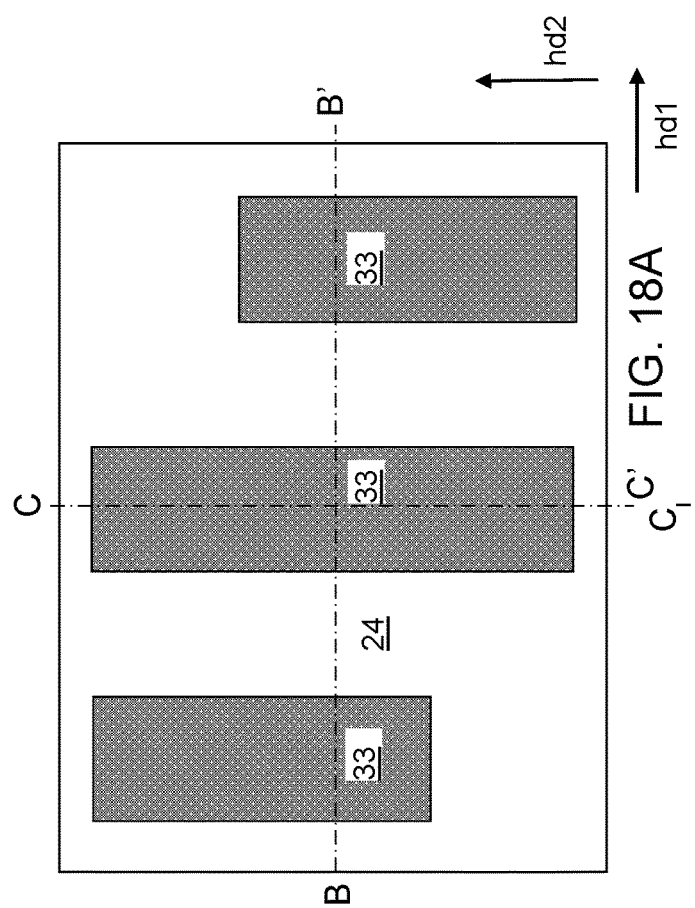
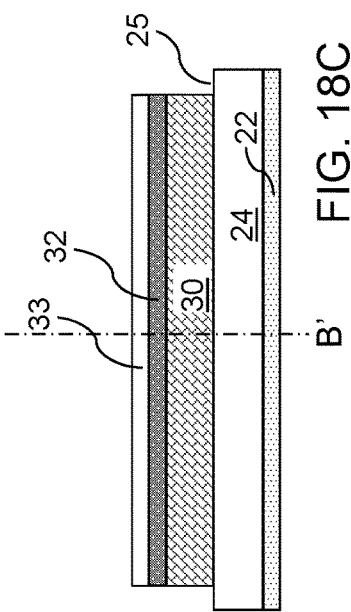
FIG. 18C
FIG. 18A
FIG. 18B

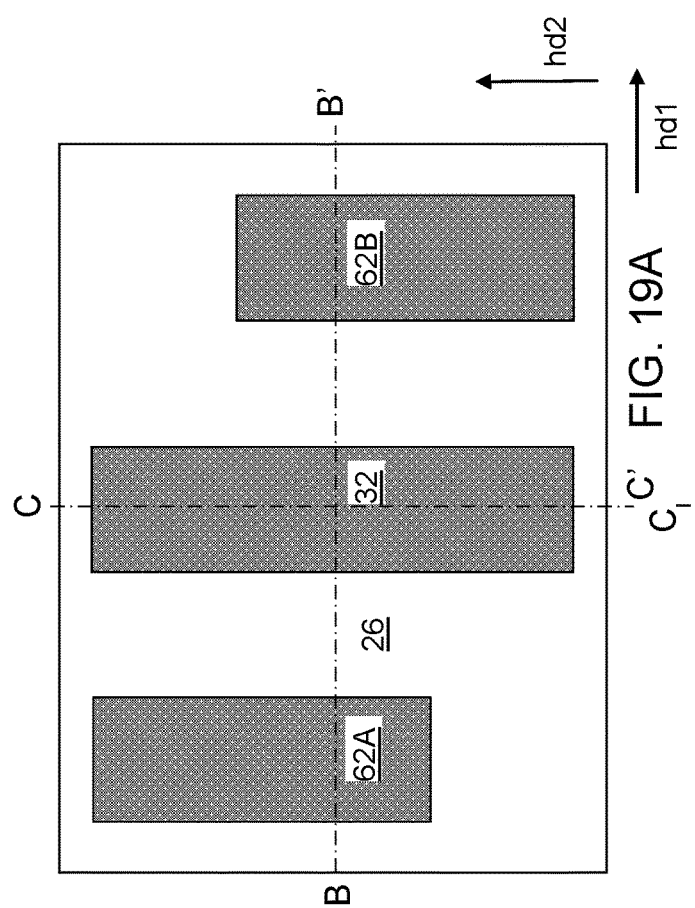
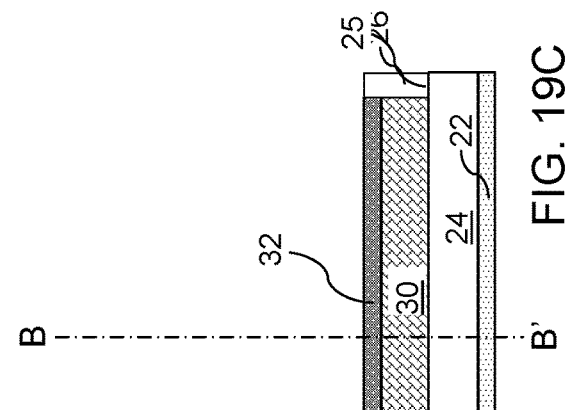
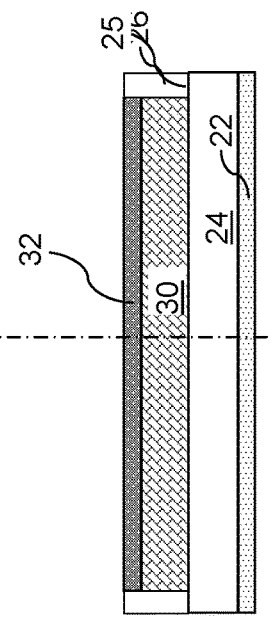
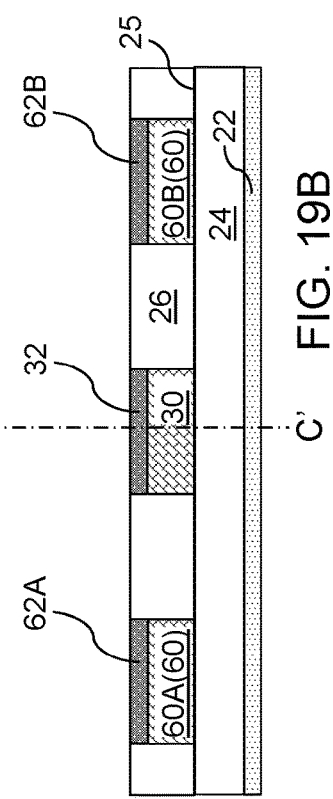
FIG. 19A
FIG. 19B
FIG. 19C

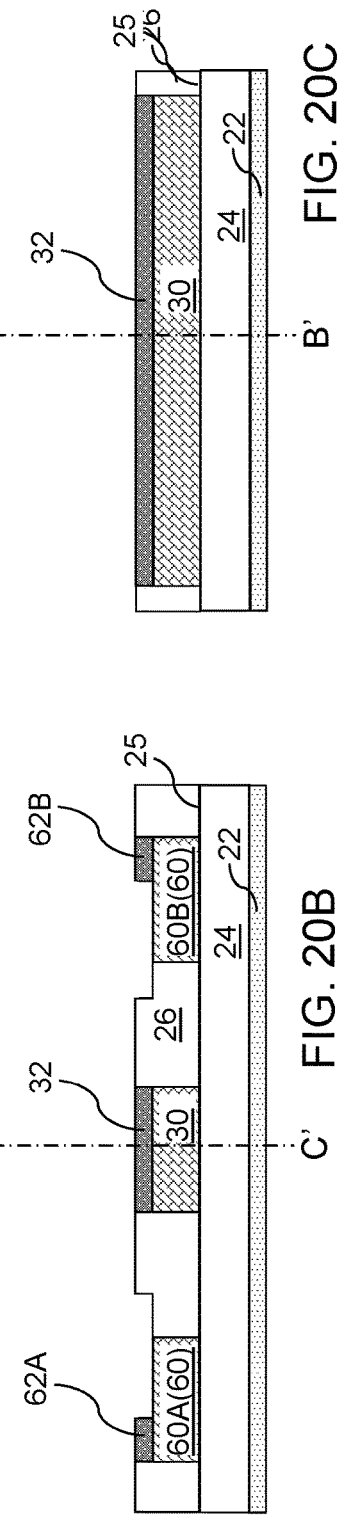
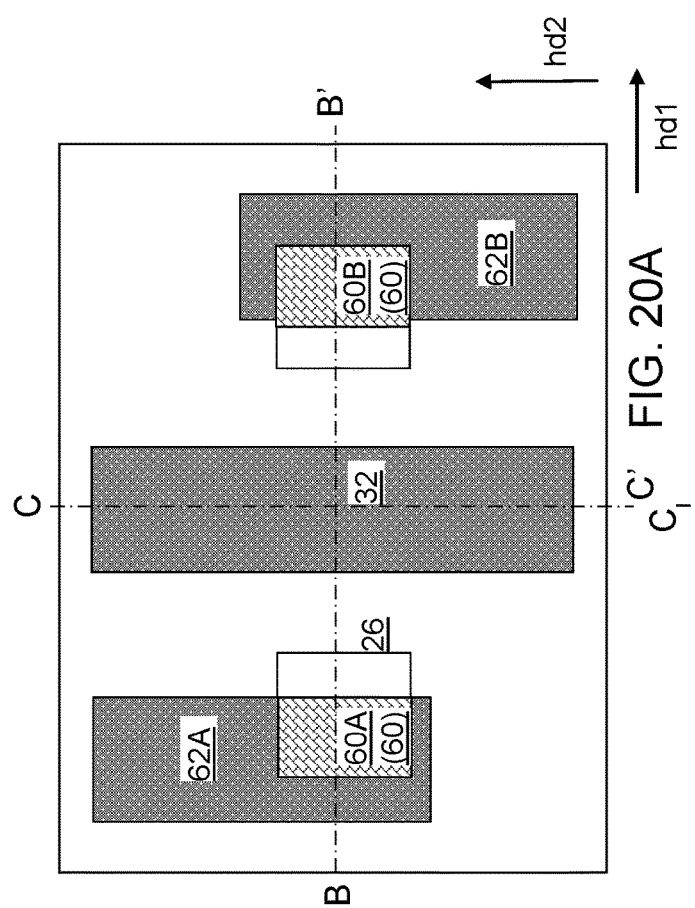

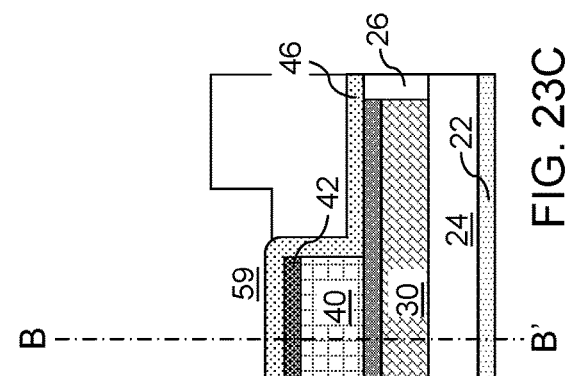
FIG. 23C
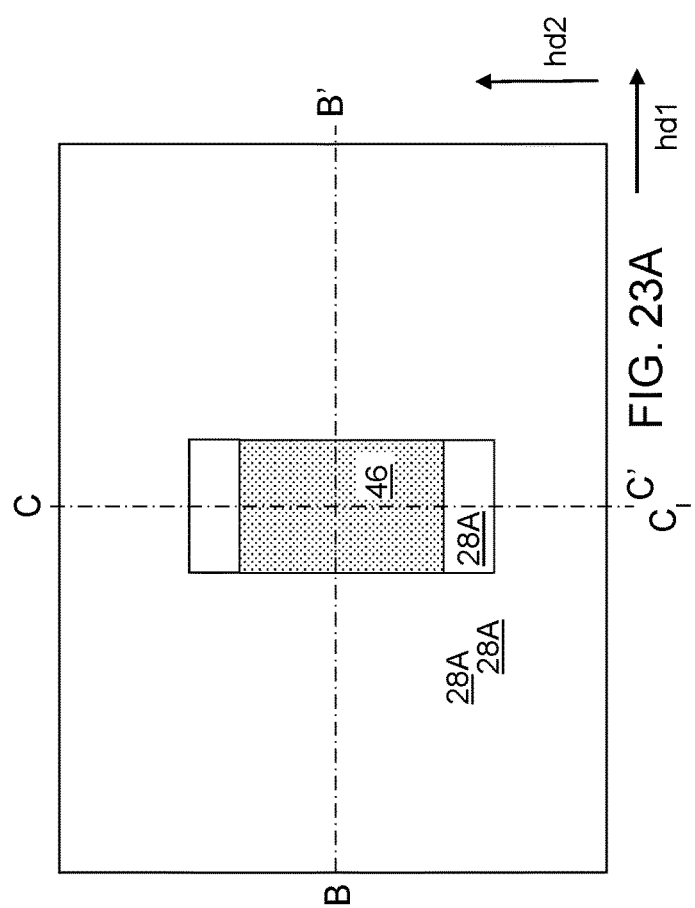
FIG. 23A
FIG. 23B

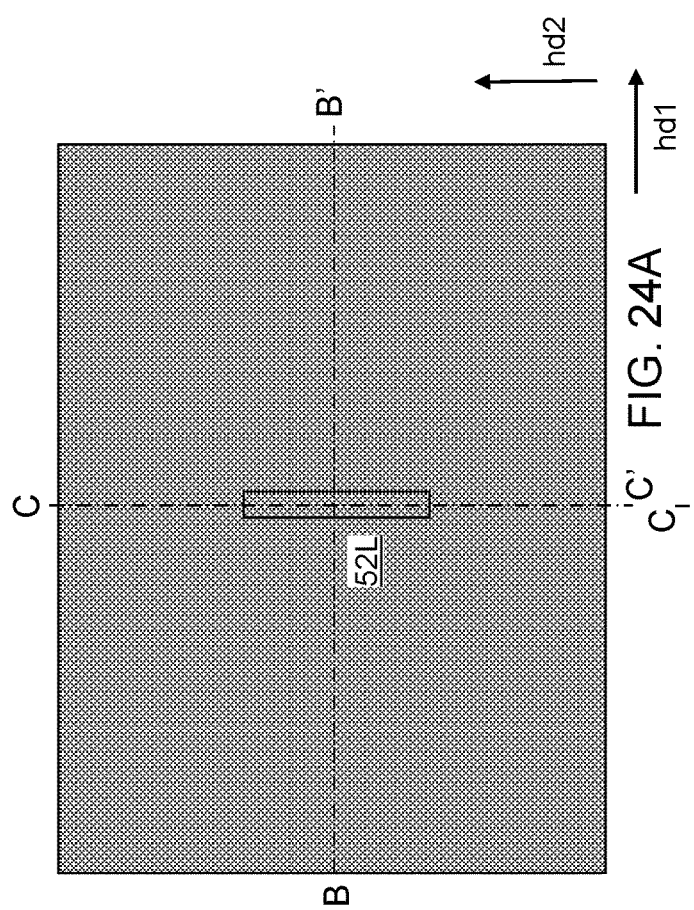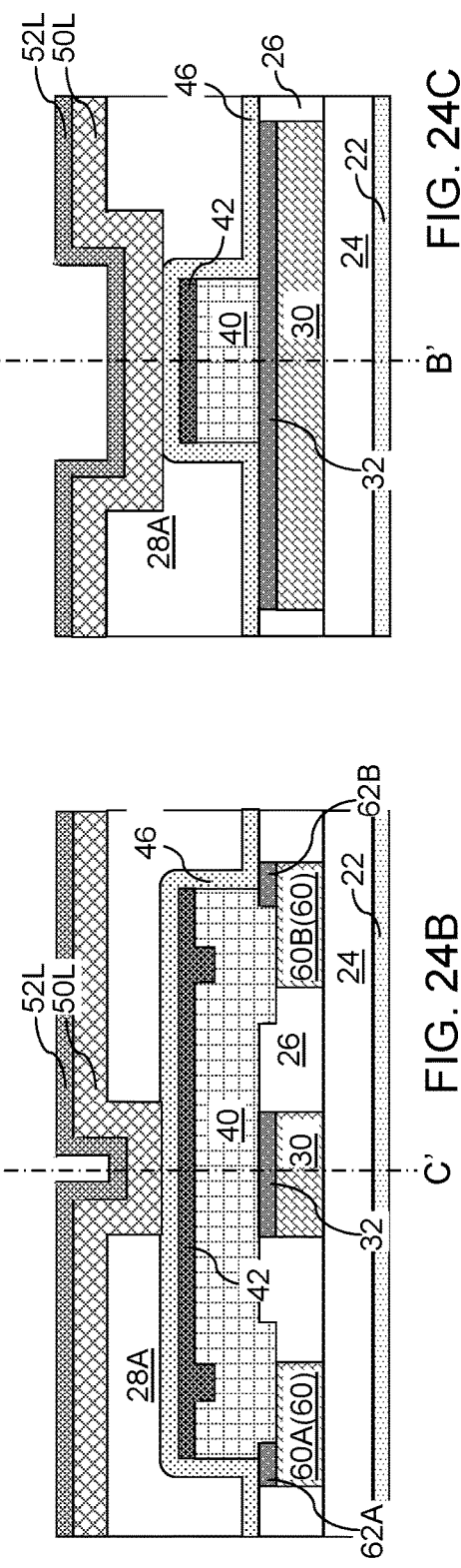

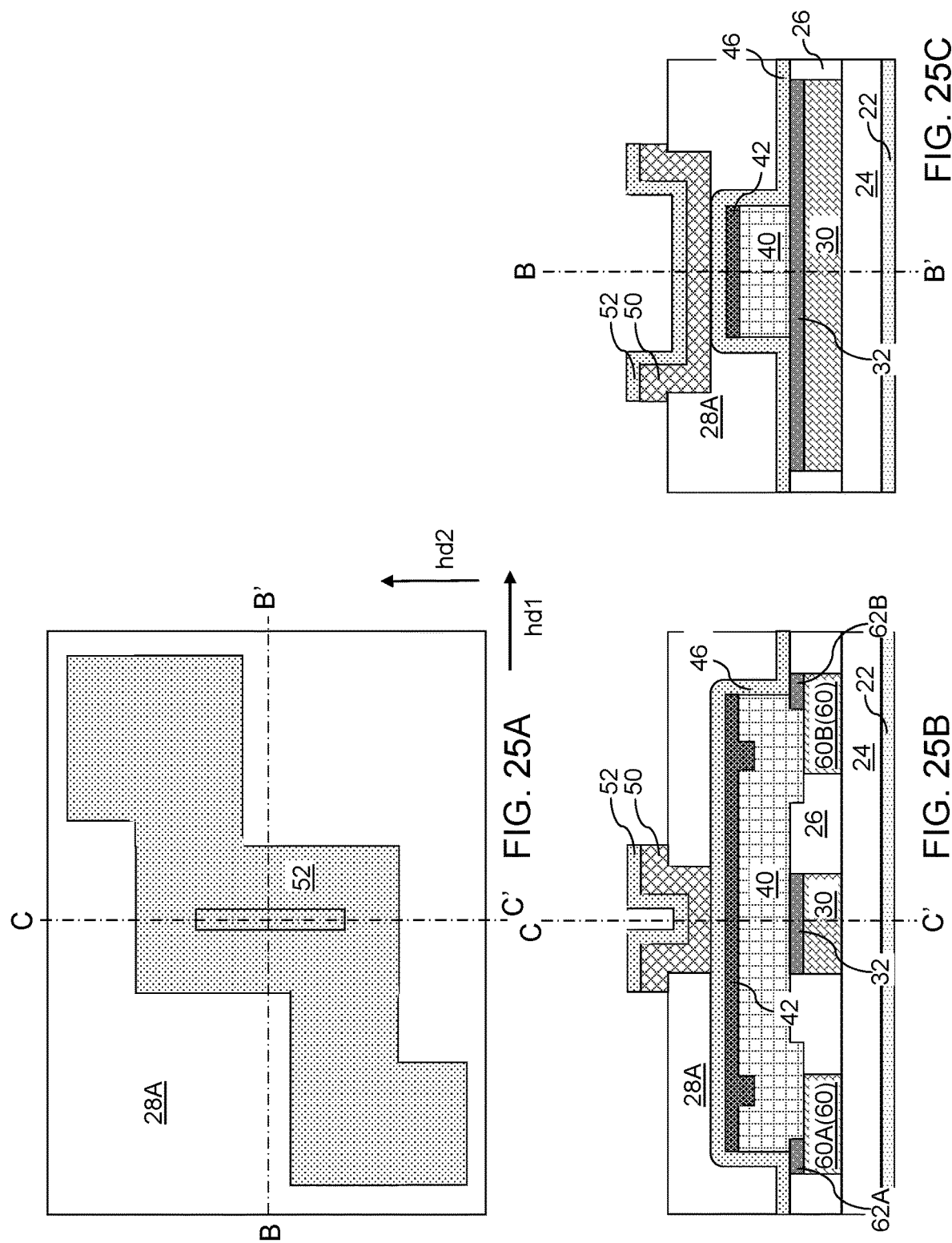

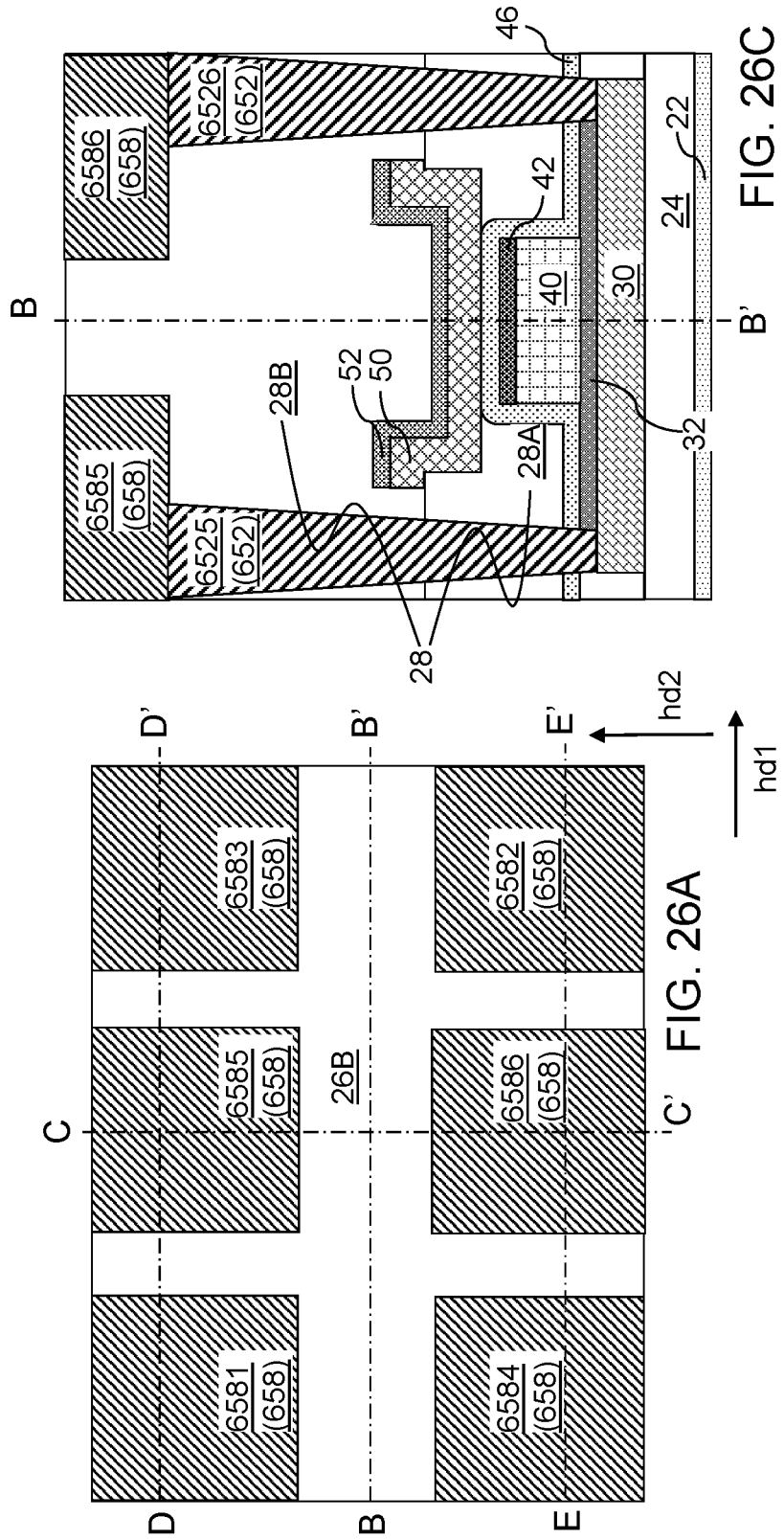

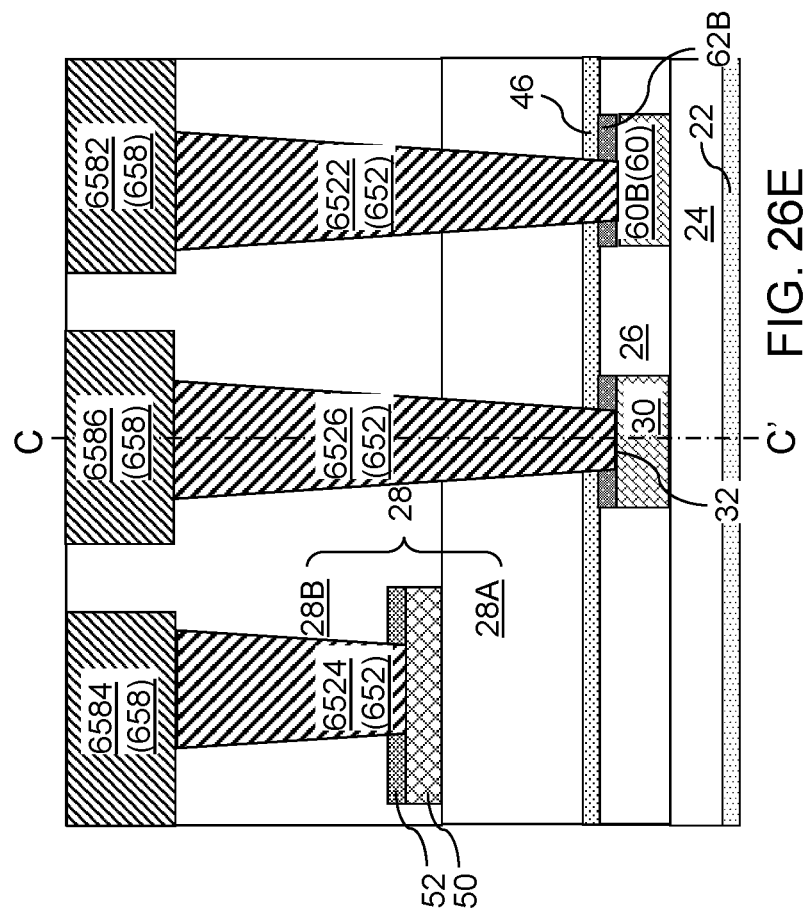

ENCAPSULATED PHASE CHANGE MATERIAL SWITCH AND METHODS FOR FORMING THE SAME

BACKGROUND

Phase change material switches are useful devices that mitigate against interference by electromagnetic radiation. Phase change material switches may be used for various applications such as radio-frequency applications. However, phase change materials may be prone to compositional damage and/or degradation during processing steps. Such damage and/or degradation may lead to a large variation in the resistivity of the phase change materials in the on state and/or in the off state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view, and FIGS. 2B and 2C are vertical cross-sectional views along the vertical plane B-B' or C-C' of FIG. 2A, respectively.

FIGS. 3A-3C are various views of the first exemplary structure after formation of an insulating matrix layer according to the first embodiment of the present disclosure. FIG. 3A is a top-down view, and FIGS. 3B and 3C are vertical cross-sectional views along the vertical plane B-B' or C-C' of FIG. 3A, respectively.

FIG. 4A is a top-down view, and FIGS. 4B and 4C are vertical cross-sectional views along the vertical plane B-B' or C-C' of FIG. 4A, respectively.

FIGS. 5A-5C are various views of the first exemplary structure after formation of a phase change material layer, a PCM-capping dielectric layer, and a sacrificial cover material layer according to the first embodiment of the present disclosure. FIG. 5A is a top-down view, and FIGS. 5B and 5C are vertical cross-sectional views along the vertical plane B-B' or C-C' of FIG. 5A, respectively.

FIG. 6A is a top-down view, and FIGS. 6B and 6C are vertical cross-sectional views along the vertical plane B-B' or C-C' of FIG. 6A, respectively.

FIGS. 7A-7D are various views of the first exemplary structure after formation of a dielectric encapsulation layer, a contact-level dielectric layer, and additional metal interconnect structures according to the first embodiment of the present disclosure. FIG. 7A is a top-down view, and FIGS. 7B, 7C, and 7D are vertical cross-sectional views along the vertical plane B-B', C-C', or D-D' of FIG. 7A, respectively.

FIGS. 8A-8C are various views of a second exemplary structure after formation of an optional dielectric capping layer, a dielectric isolation layer, a metallic material layer, and a dielectric capping material layer, and a sacrificial material layer according to a second embodiment of the present disclosure. FIG. 8A is a top-down view, and FIGS. 8B and 8C are vertical cross-sectional views along the vertical plane B-B' or C-C' of FIG. 8A, respectively.

FIGS. 9A-9C are various views of the second exemplary structure after formation of electrodes and sacrificial plates according to the second embodiment of the present disclosure. FIG. 9A is a top-down view, and FIG. 9B and FIG. 9C are vertical cross-sectional views along the vertical plane B-B' or C-C' of FIG. 9A, respectively.

FIGS. 10A-10C are various views of a second exemplary structure after formation of an insulating matrix layer according to the second embodiment of the present disclosure. FIG. 10A is a top-down view, and FIGS. 10B and 10C are vertical cross-sectional views along the vertical plane B-B' or C-C' of FIG. 10A, respectively.

FIGS. 11A-11C are various views of the second exemplary structure after formation of a phase change material layer, a PCM-capping dielectric layer, and a sacrificial cover material layer according to the second embodiment of the present disclosure. FIG. 11A is a top-down view, and FIGS. 11B and 11C are vertical cross-sectional views along the vertical plane B-B' or C-C' of FIG. 11A, respectively.

FIGS. 12A-12C are various views of the second exemplary structure after formation of a PCM-capping dielectric plate and a PCM line according to the second embodiment of the present disclosure. FIG. 12A is a top-down view, and FIGS. 12B and 12C are vertical cross-sectional views along the vertical plane B-B' or C-C' of FIG. 12A, respectively.

FIG. 13A is a top-down view, and FIGS. 13B and 13C are vertical cross-sectional views along the vertical plane B-B' or C-C' of FIG. 13A, respectively.

FIGS. 14A-14C are various views of the second exemplary structure after formation of a heater trench according to the second embodiment of the present disclosure. FIG. 14A is a top-down view, and FIGS. 14B and 14C are vertical cross-sectional views along the vertical plane B-B' or C-C' of FIG. 14A, respectively.

FIG. 15A is a top-down view, and FIGS. 15B and 15C are vertical cross-sectional views along the vertical plane B-B' or C-C', respectively.

FIG. 16A is a top-down view, and FIGS. 16B and 16C are vertical cross-sectional views along the vertical plane B-B' or C-C' of FIG. 16A, respectively.

FIGS. 17A-17D are various views of the second exemplary structure after formation of an upper contact-level dielectric layer and additional metal interconnect structures according to the second embodiment of the present disclosure. FIG. 17A is a top-down view, and FIGS. 17B, 17C, and 17D are vertical cross-sectional views along the vertical plane B-B', C-C', or D-D' of FIG. 17A, respectively.

FIGS. 18A-18C are various views of a third exemplary structure after formation of sacrificial capping plates, a heater-capping dielectric plate, electrode-capping dielectric plates, a heater line, and electrodes according to a third embodiment of the present disclosure. FIG. 18A is a top-down view, and FIGS. 18B and 18C are vertical cross-sectional views along the vertical plane B-B' or C-C' of FIG. 18A, respectively.

FIGS. 19A-19C are various views of the third exemplary structure after formation of an insulating matrix layer according to the third embodiment of the present disclosure. FIG. 19A is a top-down view, and FIGS. 19B and 19C are vertical cross-sectional views along the vertical plane B-B' or C-C' of FIG. 19A, respectively.

FIGS. 20A-20C are various views of the third exemplary structure after formation of openings through the electrode-capping dielectric plates according to the third embodiment of the present disclosure. FIG. 20A is a top-down view, and FIGS. 20B and 20C are vertical cross-sectional views along the vertical plane B-B' or C-C' of FIG. 20A, respectively.

FIG. 21A is a top-down view, and FIGS. 21B and 21C are vertical cross-sectional views along the vertical plane B-B' or C-C' of FIG. 21A, respectively.

FIG. 22A is a top-down view, and FIGS. 22B, 22C, and 22D are vertical cross-sectional views along the vertical plane B-B', C-C', or D-D' of FIG. 22A, respectively.

FIGS. 23A-23C are various views of the third exemplary structure after formation of a dielectric encapsulation layer, a lower contact-level dielectric layer, and a heater trench according to the third embodiment of the present disclosure. FIG. 23A is a top-down view, and FIGS. 23B and 23C are vertical cross-sectional views along the vertical plane B-B' or C-C' of FIG. 23A, respectively.

FIGS. 24A-24C are various views of the third exemplary structure after formation of a conductive material layer and a dielectric capping material layer according to the third embodiment of the present disclosure. FIG. 24A is a top-down view, and FIGS. 24B and 24C are vertical cross-sectional views along the vertical plane B-B' or C-C' of FIG. 24A, respectively.

FIGS. 25A-25C are various views of the third exemplary structure after formation of a heater-capping dielectric plate and a heater line according to the third embodiment of the present disclosure. FIG. 25A is a top-down view, and FIGS. 25B and 25C are vertical cross-sectional views along the vertical plane B-B' or C-C', respectively.

FIGS. 26A-26E are various views of the third exemplary structure after formation of an upper contact-level dielectric layer and additional metal interconnect structures according to the third embodiment of the present disclosure. FIG. 26A is a top-down view, and FIGS. 26B, 26C, 26D, and 26E are vertical cross-sectional views along the vertical plane B-B', C-C', D-D', or E-E' of FIG. 26A, respectively.

DETAILED DESCRIPTION

Figure 1:
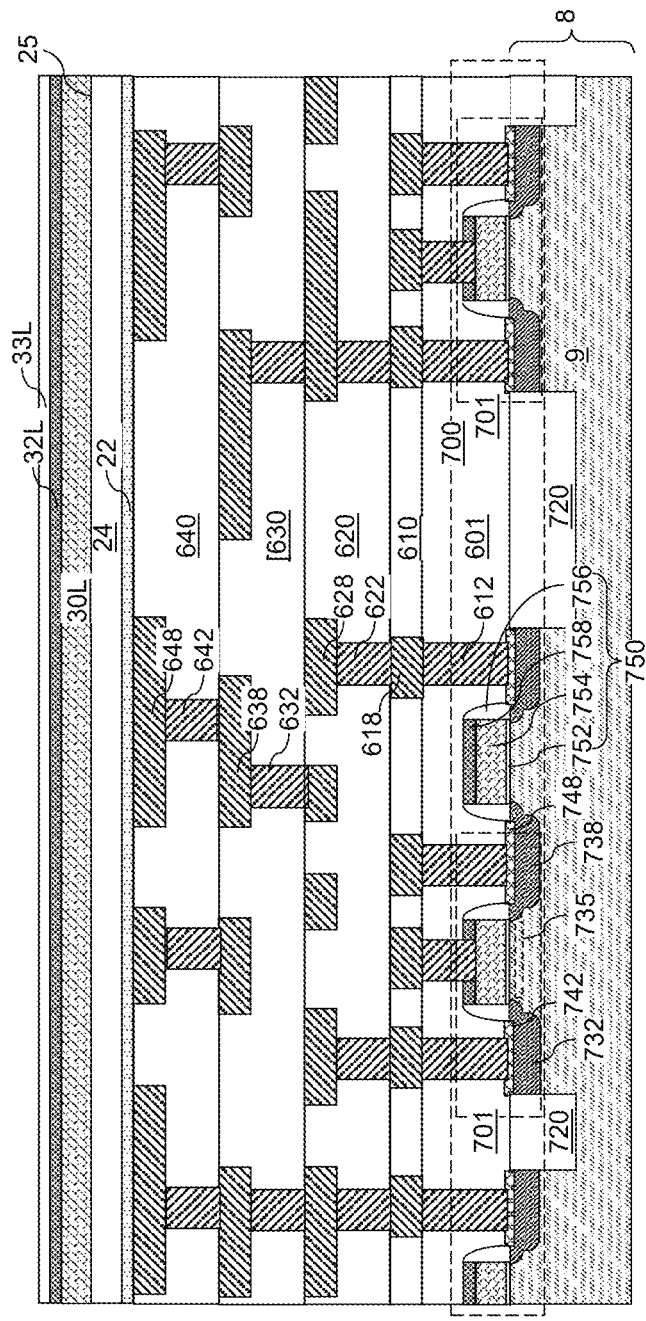
FIG. 1 is a vertical cross-sectional view of a first exemplary structure after formation of complementary metal-oxide-semiconductor (CMOS) transistors, metal interconnect structures and dielectric material layers, an optional dielectric capping layer, a dielectric isolation layer, a metallic material layer, and a dielectric capping material layer, and a sacrificial material layer according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the various embodiment structures and methods disclosed herein may be used to form a phase change material (PCM) switch. A PCM switch may be used to provide a switching function for various semiconductor devices such as radio-frequency semiconductor devices, varactors (i.e., variable capacitance capacitors), inductors, or other semiconductor devices. The various embodiments of the present disclosure are now described with reference to accompanying drawings.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738. The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

Various metal interconnect structures formed within dielectric material layers may be subsequently formed over the substrate 8 and the semiconductor devices 701 thereupon (such as field effect transistors). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, third metal line structures 638 formed in an upper portion of the third interconnect-level dielectric material layer 630, third metal via structures 642 formed in a lower portion of the fourth interconnect-level dielectric material layer 640, and fourth metal line structures 648 formed in an upper portion of the fourth interconnect-level dielectric material layer 640. While the present disclosure is described using an embodiment in which four levels metal line structures are formed in dielectric material layers, embodiments are expressly contemplated herein in which a lesser or greater number of levels of metal line structures are formed in dielectric material layers.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Generally, any contiguous set of a metal line structure (628, 638, 648) and at least one underlying metal via structure (622, 632, 642) may be formed as an integrated line and via structure.

Generally, semiconductor devices 701 may be formed on a substrate 8, and metal interconnect structures (612, 618, 622, 628, 632, 638, 642, 648) and dielectric material layers (601, 610, 620, 630, 640) over the semiconductor devices 701. The metal interconnect structures (612, 618, 622, 628, 632, 638, 642, 648) may be formed in the dielectric material layers (601, 610, 620, 630, 640), and may be electrically connected to the semiconductor devices.

An optional dielectric capping layer 22, a dielectric isolation layer 24, a metallic material layer 30L, a dielectric capping material layer 32L, and an optional sacrificial material layer 33L may be deposited over the metal interconnect structures (612, 618, 622, 628, 632, 638, 642, 648) and dielectric material layers (601, 610, 620, 630, 640). The optional dielectric capping layer 22 includes a dielectric capping material such as silicon carbide, silicon nitride, or silicon carbide nitride. Other suitable dielectric capping materials are within the contemplated scope of disclosure. The thickness of the optional dielectric capping layer 22, if present, may be in a range from 2 nm to 100 nm, although lesser and greater thicknesses may also be used. The dielectric isolation layer 24 comprises a dielectric material such as undoped silicate glass or a doped silicate glass. Other suitable dielectric isolation materials are within the contemplated scope of disclosure. The dielectric isolation layer 24 may comprise a planar top surface 25, i.e., a top surface located entirely within a horizonal plane. The thickness of the dielectric isolation layer 24 may be in a range from 100 nm to 300 nm, such as from 120 nm to 200 nm, although lesser and greater thicknesses may also be used.

The metallic material layer 30L includes a metallic material having a lower electrical conductivity than copper or aluminum. The metallic material layer 30L may comprise a refractory elemental metal such as tungsten, rhenium, tantalum, molybdenum, or niobium, or may comprises a conductive metallic nitride material such as tungsten nitride, titanium nitride, or tantalum nitride. Other suitable metallic materials are within the contemplated scope of disclosure. The thickness of the metallic material layer 30L may be in a range from 50 nm to 300 nm, such as from 100 nm to 200 nm, although lesser and greater thicknesses may also be used. The dielectric capping material layer 32L comprises a dielectric material such as silicon nitride, silicon carbide, silicon carbide nitride, or a dielectric metal oxide such as aluminum oxide, hafnium oxide, tantalum oxide, yttrium oxide, or lanthanum oxide. Other dielectric capping materials are within the contemplated scope of disclosure. The thickness of the dielectric capping material layer 32L may be in a range from 20 nm to 100 nm, such as from 30 nm to 60 nm, although lesser and greater thicknesses may also be used. The optional sacrificial material layer 33L, if present, comprises a sacrificial material such as silicon oxide. The thickness of the sacrificial material layer 33L may be in a range from 5 nm to 100 nm, such as from 10 nm to 50 nm, although lesser and greater thicknesses may also be used. Generally, a stack including at least a metallic material layer 30L and a dielectric capping material layer 32L may be formed over the planar top surface 25 of the dielectric isolation layer 24.

Figure 2C:
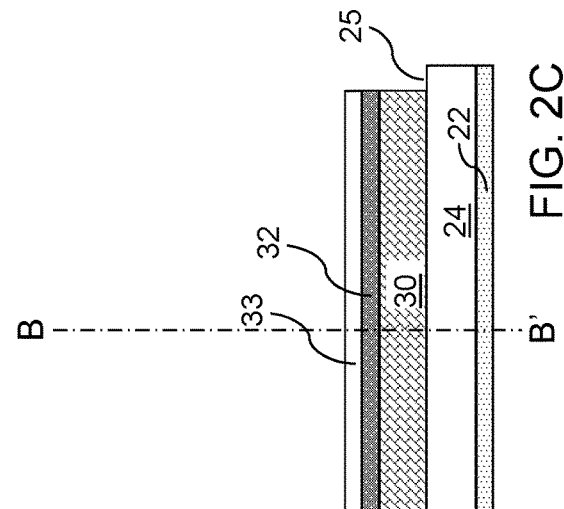
FIGS. 2A-2C are various views of the first exemplary structure after formation of sacrificial capping plates, a heater-capping dielectric plate, electrode-capping dielectric plates, a heater line, and electrodes according to a first embodiment of the present disclosure.
Figure 2A:
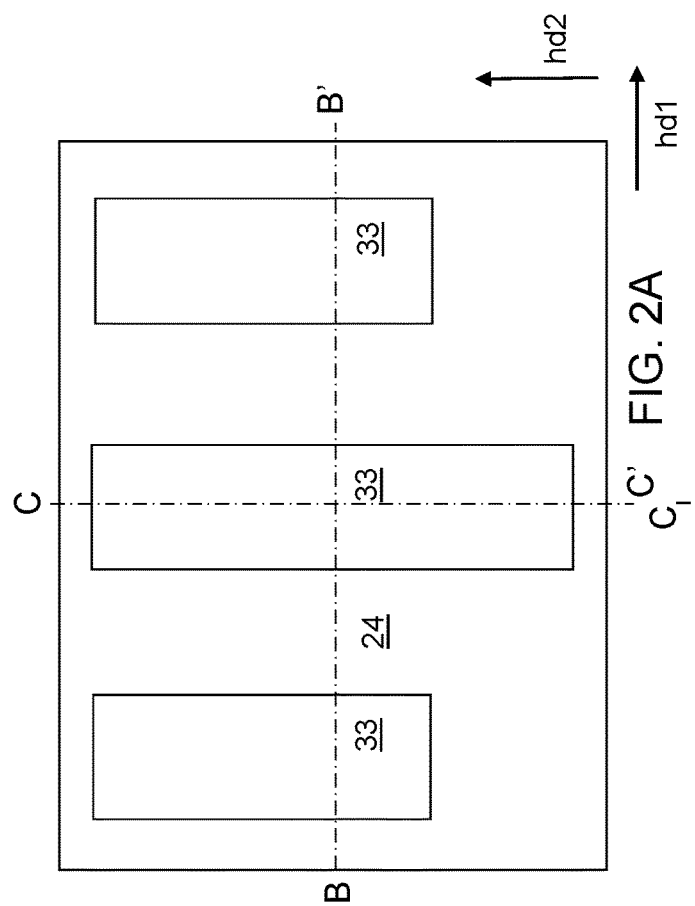
Figure 2B:
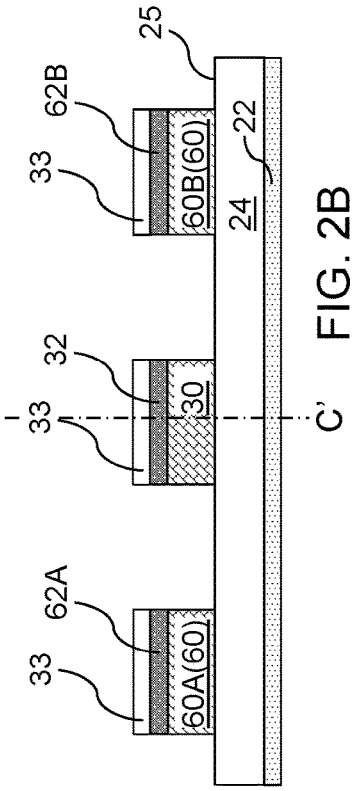

Referring to FIGS. 2A-2C, a photoresist layer (not shown) may be applied over the sacrificial material layer 33L, and may be lithographically patterned to form discrete photoresist material portions having a respective elongated horizontal cross-sectional shape such as a respective rectangular shape. In one embodiment, the elongated shapes may be rectangular shapes having a respective uniform width along a first horizontal direction hd1 and having a respective length along a second horizontal direction hd2 that is greater than the respective uniform width along a first horizontal direction hd1. An anisotropic etch process, such as a reactive ion etch process, may be performed to etch unmasked portions of the sacrificial material layer 33L, the dielectric capping material layer 32L, and the metallic material layer 30L. The anisotropic etch process may be selective to the material of the dielectric isolation layer 24, and the planar top surface 25 of the dielectric isolation layer 24 may be physically exposed in areas that are not masked by the discrete photoresist material portions.

Remaining portions of the sacrificial material layer 33L comprise sacrificial material plates 33. Remaining portions of the metallic material layer 30L comprise a heater line 30, a first electrode 60A, and a second electrode 60B. The first electrode 60A and the second electrode 60B are collectively referred to as electrodes 60. Remaining portion of the dielectric capping material layer 32L comprise a heater-capping dielectric plate 32 that contacts a top surface of the heater line 30, a first electrode-capping dielectric plate 62A that contacts a top surface of the first electrode 60A, and a second electrode-capping dielectric plate 62B that contacts a top surface of the second electrode 60B.

In one embodiment, the heater line 30, the heater-capping dielectric plate 32, and a sacrificial material plate 33 that contacts the heater-capping dielectric plate 32 may have the same area. In one embodiment, the first electrode 60A, the first electrode-capping dielectric plate 62A, and a sacrificial material plate 33 that contacts the first electrode-capping dielectric plate 62A may have the same area. In one embodiment, the second electrode 60B, the second electrode-capping dielectric plate 62B, and a sacrificial material plate 33 that contacts the second electrode-capping dielectric plate 62B may have the same area. In one embodiment, sidewalls of the heater line 30, the heater-capping dielectric plate 32, and an overlying sacrificial material plate 33 may be vertically coincident, i.e., overlie or underlie one another and are located within a same vertical plane. In one embodiment, sidewalls of the first electrode 60A, the first electrode-capping dielectric plate 62A, and an overlying sacrificial material plate 33 may be vertically coincident. In one embodiment, sidewalls of the second electrode 60B, the second electrode-capping dielectric plate 62B, and an overlying sacrificial material plate 33 may be vertically coincident.

The heater line 30 may contact a first area of the planar top surface 25 of the dielectric isolation layer 24, and the heater-capping dielectric plate 32 contacts the top surface of the heater line 30. The first electrode 60A contacts a second area of the planar top surface 25 of the dielectric isolation layer 24, and the first electrode-capping dielectric plate 62A contacts the top surface of the first electrode 60A. The second electrode 60B contacts a third area of the planar top surface 25 of the dielectric isolation layer 24, and the second electrode-capping dielectric plate 62B contacts the top surface of the second electrode 60B. The heater line 30, the first electrode 60A, and the second electrode 60B may have the same material composition and the same thickness. The heater-capping dielectric plate 32, the first electrode-capping dielectric plate 62A, and the second electrode-capping dielectric plate 62B may have the same material composition and the same thickness. The sacrificial material plates 33 may have the same material composition and the same thickness. The discrete photoresist material portions may be subsequently removed, for example, by ashing.

The heater line 30 may have a horizontal cross-sectional shape of a rectangle, and may, or may not, include optional lateral protrusions (not illustrated) in any direction at lengthwise end portions. In embodiments in which lateral protrusions are used, the optional lateral protrusions may be advantageously used to increase a contact area between the heater line 30 and heater contact via structures to be subsequently formed. While the first electrode 60A and the second electrode 60B are described in a configuration having a respective rectangular horizontal cross-sectional shape, embodiments are expressly contemplated in which the first electrode 60A and/or the second electrode 60B have a respective non-rectangular horizontal cross-sectional shape. In one embodiment, the heater line 30, the first electrode 60A, and the second electrode 60B may be formed on a first area, a second area, and a third area, respectively, of the planar top surface 25 of the dielectric isolation layer 24.

Referring to FIGS. 3A-3C, an insulating material such as undoped silicate glass or a doped silicate glass may be deposited around the heater line 30 and the electrodes 60. The insulating material may be the same as, or may be different from, the material of the sacrificial material plates 33. A planarization process such as a chemical mechanical polishing (CMP) process may be performed to remove portions of the deposited insulating material that overlie the horizontal plane including the top surfaces of the heater-capping dielectric plate 32 and the electrode-capping dielectric plates (62A, 62B). The sacrificial material plates 33 may be collaterally removed during the planarization process. The top surface of the heater-capping dielectric plate 32 and the electrode-capping dielectric plates (62A, 62B) may be used as planarization stopping surfaces for the planarization process. The remaining portion of the deposited insulating material forms a matrix embedding the heater line 30 and the electrodes 60, and is herein referred to as an insulating matrix layer 26. The top surface of the insulating matrix layer 26 may be located within the horizontal plane including the top surfaces of the heater-capping dielectric plate 32 and the electrode-capping dielectric plates (62A, 62B). The insulating matrix layer 26 may be formed around the heater line 30, the first electrode 60A, and the second electrode 60B.

Figure 4C:
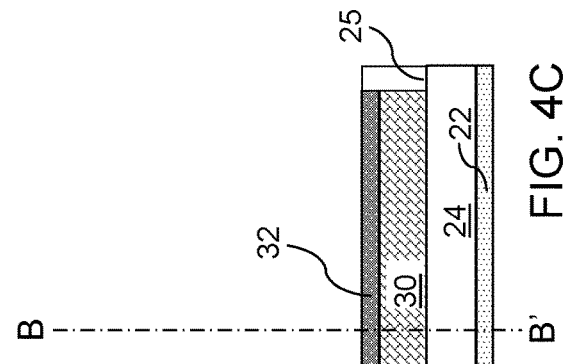
FIGS. 4A-4C are various views of the first exemplary structure after formation of openings through the electrode-capping dielectric plates according to the first embodiment of the present disclosure.
Figure 4A:
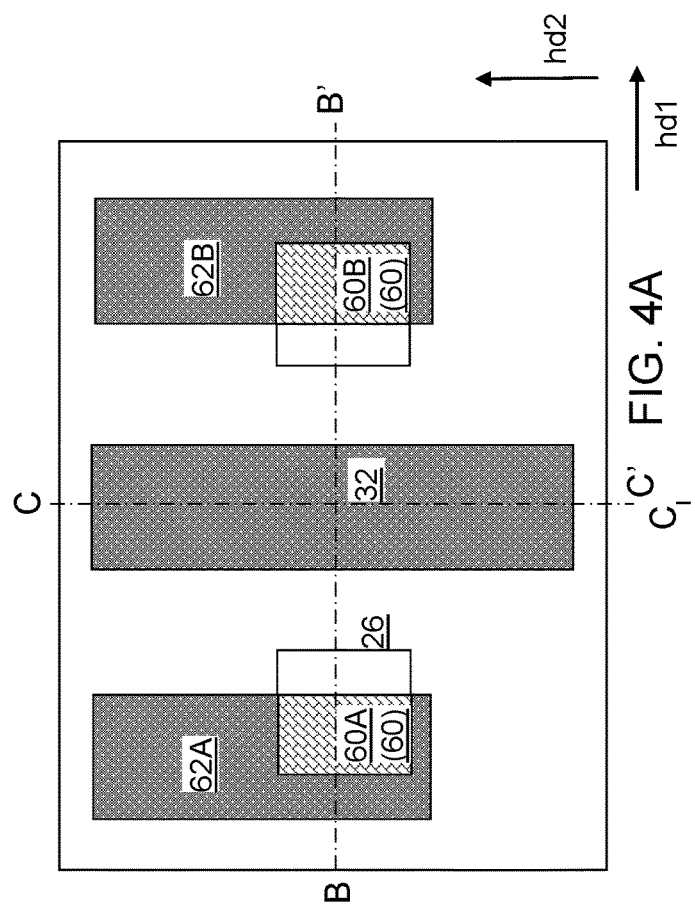
Figure 4B:
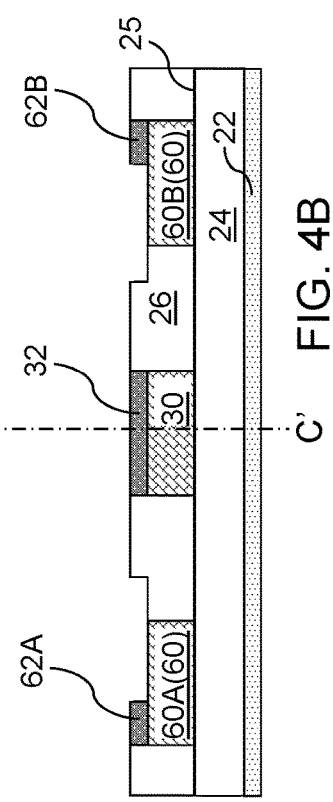

Referring to FIGS. 4A-4C, a photoresist layer (not shown) may be applied over the insulating matrix layer 26, the heater-capping dielectric plate 32, and the electrode-capping dielectric plates (62A, 62B), and may be lithographically patterned to form openings over portions of the electrode-capping dielectric plates (62A, 62B) that are proximal to the heater-capping dielectric plate 32. In one embodiment, the area of each opening in the photoresist layer may overlie an edge of a respective one of the electrode-capping dielectric plates (62A, 62B) that is proximal to the heater-capping dielectric plate 32.

An anisotropic etch process may be performed to remove portions of the electrode-capping dielectric plates (62A, 62B) that are not covered by the patterned photoresist layer. The anisotropic etch process may form openings through the electrode-capping dielectric plates (62A, 62B) within the areas of the openings in the patterned photoresist layer. Specifically, a portion of the first electrode-capping dielectric plate 62A and a portion of the second electrode-capping dielectric plate 62B may be removed, and a segment of the top surface of the first electrode 60A and a segment of the top surface of the second electrode 60B may be physically exposed underneath the openings in the patterned photoresist layer. Unmasked portions of the insulating matrix layer 26 may be collaterally recessed during the anisotropic etch process.

While the present disclosure is described using an embodiment in which the openings in the patterned photoresist layer have rectangular horizontal cross-sectional shapes, the horizontal cross-sectional shapes of the openings in the photoresist layer may be generally any two-dimensional curvilinear shape having a closed periphery, such as a circle, an oval, a polygon, or a two-dimensional shape including at least one straight line segment and at least one curved segment. The patterned photoresist layer may be subsequently removed, for example, by ashing.

Referring to FIGS. 5A-5C, a phase change material (PCM) layer 40L, a PCM-capping dielectric layer 42L, and a sacrificial cover material layer 43L may be formed over the heater-capping dielectric plate 32, the electrode-capping dielectric plates (62A, 62B), physically exposed segments of the top surfaces of the electrodes 60, and the top surface of the insulating matrix layer 26. As used herein, a "phase change material" refers to a material having at least two different phases providing different resistivity. A phase change material (PCM) may be used to store information as a resistivity state of a material that may be in different resistivity states corresponding to different phases of the material. The different phases may include an amorphous state having high resistivity and a crystalline state having low resistivity (i.e., a lower resistivity than in the amorphous state). The transition between the amorphous state and the crystalline state may be induced by controlling the rate of cooling after application of an electrical pulse that renders the phase change material amorphous in a first part of a programming process. The second part of the programming process includes control of the cooling rate of the phase change material. In embodiments in which rapid quenching occurs, the phase change material may cool into an amorphous high resistivity state. In embodiments in which slow cooling occurs, the phase change material may cool into a crystalline low resistivity state.

Exemplary phase change materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds. The phase change material may be doped (e.g., nitrogen doped GST) or undoped to enhance resistance-switching characteristics. The thickness of the phase change material layer 40L (which is also referred to as a PCM material layer 40L) may be in a range from 30 nm to 600 nm, such as from 60 nm to 300 nm, although lesser and greater thicknesses may also be used.

The PCM capping dielectric layer 42L comprises a dielectric material such as silicon nitride, silicon carbide, silicon carbide nitride, or a dielectric metal oxide such as aluminum oxide, hafnium oxide, tantalum oxide, yttrium oxide, or lanthanum oxide. The thickness of the PCM capping dielectric layer 42L may be in a range from 20 nm to 100 nm, such as from 30 nm to 60 nm, although lesser and greater thicknesses may also be used. The optional sacrificial cover material layer 43L, if present, comprises a sacrificial material such as silicon oxide. The thickness of the sacrificial cover material layer 43L may be in a range from 5 nm to 100 nm, such as from 10 nm to 50 nm, although lesser and greater thicknesses may also be used.

Figure 6A:
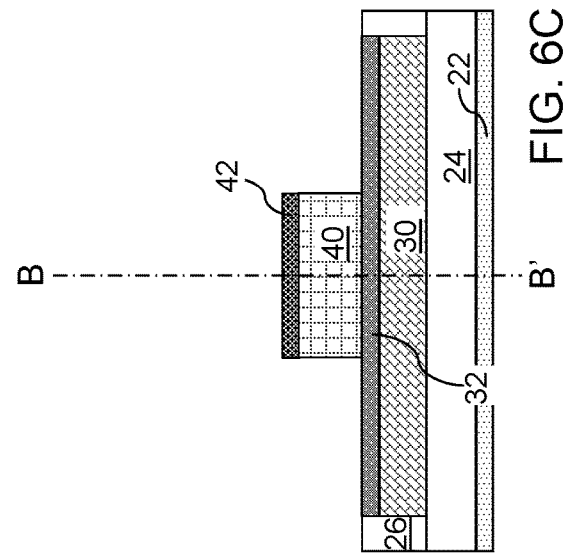
FIGS. 6A-6C are various views of the first exemplary structure after formation of a PCM-capping dielectric plate and a phase change material (PCM) line according to the first embodiment of the present disclosure.
Figure 6B:
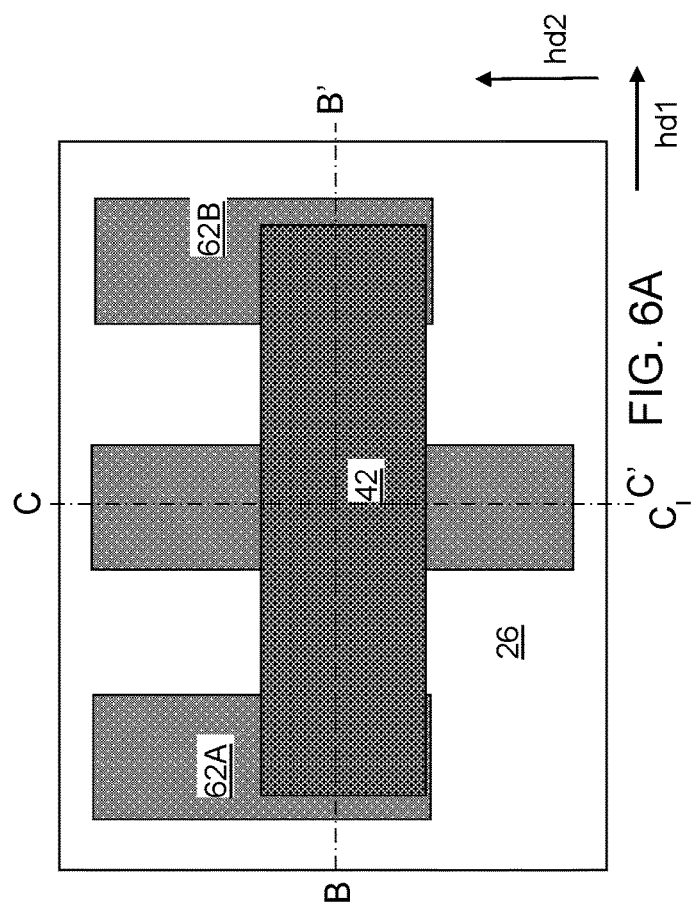
Figure 6C:
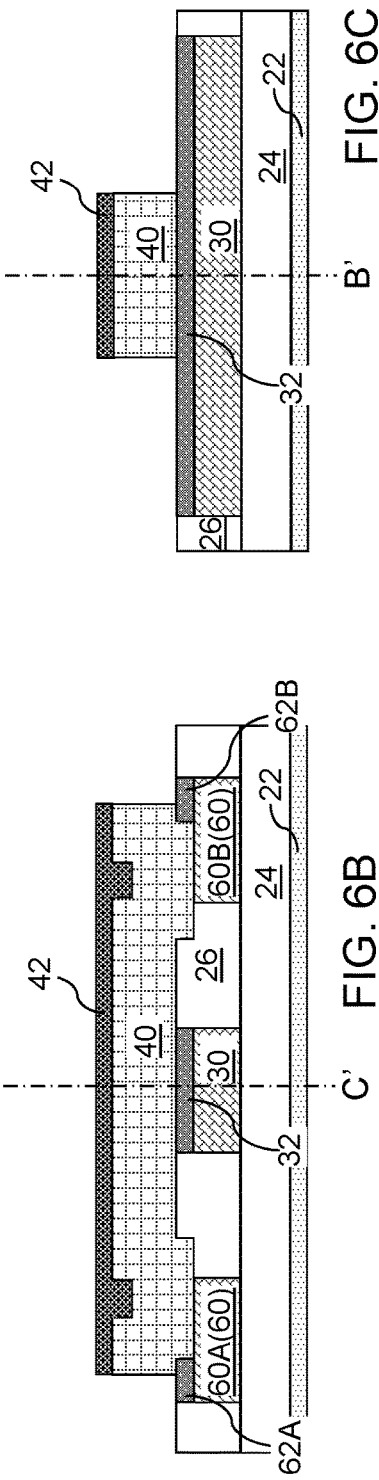

Referring to FIGS. 6A-6C, a photoresist layer (not shown) may be applied over the optional sacrificial cover material layer 43L and the PCM-capping dielectric layer 42L, and may be lithographically patterned to provide an elongated photoresist material portion that straddles the heater-capping dielectric plate 32, and overlaps with the entire contact areas between the PCM material layer 40L and the electrodes (60A, 60B). Unmasked portions of the optional sacrificial cover material layer 43L, the PCM-capping dielectric layer 42L, and the PCM material layer 40L may be etched by performing an anisotropic etch process that uses the patterned photoresist material portion as an etch mask. A remaining portion of the PCM-capping dielectric layer 42L comprises a PCM-capping dielectric plate 42. A remaining portion of the PCM material layer 40L comprises a phase change material line 40, which is also referred to as a PCM line 40. Any remaining portion of the optional sacrificial cover material layer 43L may be removed by performing an etch process (such as an isotropic etch process) that etches the material of the sacrificial cover material layer 43L selective to the materials of the PCM-capping dielectric plate 42 and the PCM line 40. For example, a wet etch process using hydrofluoric acid may be used if the sacrificial cover material layer 43L comprises undoped silicate glass or a doped silicate glass.

Generally, the phase change material (PCM) line 40 may be formed over the insulating matrix layer 26. The PCM line 40 and the PCM-capping dielectric plate 42 straddle the combination of the heater line 30 and the heater-capping dielectric plate 32. The heater line 30 underlies the PCM line 40. A first end portion of the PCM line 40 contacts a top surface of the first electrode 60A, and a second end portion of the PCM line 40 contacts a top surface of the second electrode 60B. In on embodiment, the PCM line 40 comprises a middle portion overlying the heater line 30, a first end portion contacting a first segment of the top surface of the first electrode 60A, and a second end portion contacting a first segment of the top surface of the second electrode 60B.

A heater-capping dielectric plate 32 contacts the top surface of the heater line 30, and contacts the bottom surface of the middle portion of the PCM line 40. In one embodiment, the first electrode-capping dielectric plate 62A contacts a second segment of the top surface of the first electrode 60A, and the second electrode-capping dielectric plate 62B contacts a second segment of the top surface of the second electrode 60B. In one embodiment, the insulating matrix layer 26 laterally surrounds the heater line 30, the first electrode 60A, the second electrode 60B, the first electrode-capping dielectric plate 62A, the second electrode-capping dielectric plate 62B, a first downward-protruding portion of the PCM line 40 that contacts the first electrode 60A, and a second downward-protruding portion of the PCM line 40 that contacts the second electrode 60B. The first downward-protruding portion of the PCM line 40 and the second downward-protruding portion of the PCM line 40 may have the same height as the electrode-capping dielectric plates (62A, 62B).

Referring to FIGS. 7A-7D, a dielectric encapsulation layer 46 may be formed by conformal deposition of a dielectric encapsulation material. The dielectric encapsulation material may comprise a passivation dielectric material that may be used to prevent or suppress reaction of the phase change material in the PCM line 40 with adjacent material portions. In one embodiment, the dielectric encapsulation layer 46 may comprise a dielectric nitride material such as silicon nitride or silicon carbide nitride. In one embodiment, the dielectric encapsulation layer 46 may comprises silicon atoms at an atomic percentage less than 50%, the balance of the atomic percentage being the atomic percentage of nitrogen and/or carbon atoms. The thickness of the dielectric encapsulation layer 46 may be uniform or substantially uniform, and the thickness of the dielectric encapsulation layer 46 may be in a range from 50 nm to 300 nm, such as from 100 nm to 200 nm, although lesser and greater thicknesses may also be used.

Generally, damage to the PCM material induces compositional variations in the damaged portion of the PCM material. Thus, damage to the PCM material causes variations in the resistivity of the PCM material in the low resistivity state, and causes variations in the resistance across the first electrode 60A and the second electrode 60B while the PCM line is in the low resistivity state (i.e., the "on-state"). According to an aspect of the present disclosure, the dielectric encapsulation layer 46 may be used to mitigate against damages to the PCM material in the PCM line 40 during subsequent processing steps. For example, the PCM material may be protected from plasma damage that may occur during formation of openings in a passivation dielectric layer (not illustrated) that may be subsequently formed over the PCM switch device of the present disclosure.

Specifically, the dielectric encapsulation layer 46 encapsulates the PCM material of the PCM line 40 from above and at all sidewalls of the PCM line 40. In one embodiment, the dielectric encapsulation layer 46 contacts the entirety of the top surface of the PCM-capping dielectric plate 42. The dielectric encapsulation layer 46 covers the entire area of the PCM line 40, and contacts the entirety of all sidewalls of the PCM line 40. The dielectric encapsulation layer 46 contacts a segment of a top surface of the first electrode-capping dielectric plate 62A, a segment of a top surface of the second electrode-capping dielectric plate 62B, and two segments of a top surface of the heater-capping dielectric plate 32.

Subsequently, a dielectric material layer 28 may be deposited over the encapsulation dielectric layer 46. The dielectric material layer 28 may also be referred to as a switch-level dielectric material layer 28. Additional metal interconnect structures (652, 658) may be formed in the switch-level dielectric material layer 28. The additional metal interconnect structures (652, 658) are herein referred to as switch-level metal interconnect structures (652, 658), and may comprise switch-level metal line structures 658 and switch-level metal via structures 652.

The switch-level metal via structures 652 may comprise a first electrode contact via structure 6521 contacting the first electrode 60A, a second electrode contact via structure 6522 contacting the second electrode 60B, a first heater contact via structure 6523 contacting a first end portion of the heater line 30, and a second heater contact via structure 6524 contacting a second end portion of the heater line 30. The switch-level metal line structures 658 may comprise a first electrode connection metal line structure 6581 contacting a top surface of the first electrode contact via structure 6521, a second electrode connection metal line structure 6582 contacting a top surface of the second electrode contact via structure 6522, a first heater connection metal line structure 6583 contacting a top surface of the first heater contact via structure 6523, and a second heater connection metal line structure 6584 contacting a top surface of the second heater contact via structure 6524.

Generally, semiconductor devices 701 may be formed on the substrate 8, and metal interconnect structures (612, 618, 622, 628, 632, 638, 642, 648) and dielectric material layers (601, 610, 620, 630, 640) may be formed over the substrate 8. The metal interconnect structures (612, 618, 622, 628, 632, 638, 642, 648) are formed in the dielectric material layers (601, 610, 620, 630, 640). The dielectric isolation layer 24 is formed over metal interconnect structures (612, 618, 622, 628, 632, 638, 642, 648).

The first heater contact via structure 6523 may contact a top surface of a first end portion of the heater line 30, and may contact a first sidewall of the heater-capping dielectric plate 32 and a cylindrical sidewall of a first opening through the encapsulation dielectric layer 46. The second heater contact via structure 6524 may contact a top surface of a second end portion of the heater line 30, and may contact a second sidewall of the heater-capping dielectric plate 32 and a cylindrical sidewall of a second opening through the encapsulation dielectric layer 46. The first electrode contact via structure 6521 may contact a top surface of the first electrode 60A and a cylindrical sidewall of a third opening through the encapsulation dielectric layer 46. The second electrode contact via structure 6522 may contact a top surface of the second electrode 60B and a cylindrical sidewall of a fourth opening through the encapsulation dielectric layer 46.

The two end portions of the heater line 30, the first electrode 60A, and the second electrode 60B may be electrically connected to a respective one of the metal interconnect structures (612, 618, 622, 628, 632, 638, 642, 648) by forming additional metal interconnect structures (652, 658), which include additional switch-level metal via structures (not illustrated) that connect a respective one of the switch-level metal line structures 658 to a respective one of the fourth metal line structures 648.

In one embodiment, the first electrode contact via structure 6521 vertically extends through the switch-level dielectric material layer 28, the dielectric encapsulation layer 46, and the first electrode-capping dielectric plate 62A, and contacts the top surface of the first electrode 60A. The second electrode contact via structure 6522 vertically extends through the switch-level dielectric material layer 28, the dielectric encapsulation layer 46, and the second electrode-capping dielectric plate 62B, and contacts the top surface of the second electrode 60B. The first heater contact via structure 6523 vertically extends through the switch-level dielectric material layer 28, the dielectric encapsulation layer 46, and a first end portion of the heater-capping dielectric plate 32, and contacts a top surface of a first end portion of the heater line 30. The second heater contact via structure 6524 vertically extending through the switch-level dielectric material layer 28, the dielectric encapsulation layer 46, and a second end portion of the heater-capping dielectric plate 32, and contacts a top surface of a second end portion of the heater line 30.

In one embodiment, the heater line 30, the first electrode 60A, and the second electrode 60B may be located on a first area, a second area, and a third area, respectively, of the planar top surface 25 of the dielectric isolation layer 24. The phase change material (PCM) line 40 comprises a middle portion overlying the heater line 30, a first end portion contacting a first segment of a top surface of the first electrode 60A, and a second end portion contacting a first segment of a top surface of the second electrode 60B. The dielectric encapsulation layer 46 contacts all sidewalls of the phase change material line 40, and overlies an entirety of the top surface of the phase change material line 40.

Subsequently, bonding-level structures such as a passivation dielectric layer and metal bonding pads may be formed over the switch-level dielectric material layer as needed.

Referring to FIGS. 8A-8C, a second exemplary structure according to a second embodiment of the present disclosure may be derived from the first exemplary structure illustrated in FIG. 1 by omitting formation of the dielectric capping material layer 32L. In this embodiment, the optional sacrificial material layer 33L may be formed directly on the top surface of the metallic material layer 30L.

Referring to FIGS. 9A-9C, a photoresist layer (not shown) may be applied over the sacrificial material layer 33L, and may be lithographically patterned to form a pair of discrete photoresist material portions that are laterally spaced apart along a first horizontal direction hd1. In one embodiment, the discrete photoresist material portions may have elongated shaped. In one embodiment, the elongated shapes may be rectangular shapes having a respective uniform width along the first horizontal direction hd1 and having a respective length that is greater than the respective uniform width along a second horizontal direction hd2. An anisotropic etch process, such as a reactive ion etch process, may be performed to etch unmasked portions of the sacrificial material layer 33L and the metallic material layer 30L. The anisotropic etch process may be selective to the material of the dielectric isolation layer 24, and the planar top surface 25 of the dielectric isolation layer 24 may be physically exposed in areas that are not masked by the discrete photoresist material portions.

Remaining portions of the sacrificial material layer 33L comprise sacrificial material plates 33. Remaining portions of the metallic material layer 30L comprise a first electrode 60A and a second electrode 60B. The first electrode 60A and the second electrode 60B are collectively referred to as electrodes 60. In one embodiment, the first electrode 60A and an overlying sacrificial material plate 33 may have the same area. In one embodiment, the second electrode 60B and an overlying sacrificial material plate 33 may have the same area. In one embodiment, sidewalls of the first electrode 60A and an overlying sacrificial material plate 33 may be vertically coincident. In one embodiment, sidewalls of the second electrode 60B and an overlying sacrificial material plate 33 may be vertically coincident.

The first electrode 60A contacts an area of the planar top surface 25, and the second electrode 60B contacts another area of the planar top surface 25. The first electrode 60A and the second electrode 60B may have the same material composition and the same thickness. The sacrificial material plates 33 may have the same material composition and the same thickness. The discrete photoresist material portions may be subsequently removed, for example, by ashing.

Referring to FIGS. 10A-10C, an insulating material such as undoped silicate glass or a doped silicate glass may be deposited around the electrodes 60. The insulating material may be the same as, or may be different from, the material of the sacrificial material plates 33. A planarization process such as a chemical mechanical polishing (CMP) process may be performed to remove portions of the deposited insulating material that overlie the horizontal plane including the top surfaces of the electrodes 60. The sacrificial material plates 33 may be collaterally removed during the planarization process. The top surface of the electrodes 60 may be used as planarization stopping surfaces for the planarization process. The remaining portion of the deposited insulating material forms a matrix embedding the electrodes 60, and is herein referred to as an insulating matrix layer 26. The top surface of the insulating matrix layer 26 may be located within the horizontal plane including the top surfaces of the electrodes 60. The insulating matrix layer 26 is formed around the first electrode 60A and the second electrode 60B. The first electrode 60A and the second electrode 60B may be located on the planar top surface 25 of the dielectric isolation layer 24, and may be laterally surrounded by the insulating matrix layer 26.

Referring to FIGS. 11A-11C, a phase change material (PCM) layer 40L, a PCM-capping dielectric layer 42L, and a sacrificial cover material layer 43L may be formed over top surfaces of the electrodes 60 and the insulating matrix layer 26. Each of the PCM material layer 40L, the PCM-capping dielectric layer 42L, and the sacrificial cover material layer 43L may have the same material composition and the same thickness range as in the first exemplary structure.

Referring to FIGS. 12A-12C, a photoresist layer (not shown) may be applied over the optional sacrificial cover material layer 43L and the PCM-capping dielectric layer 42L, and may be lithographically patterned to provide an elongated photoresist material portion that continuous extends between the electrodes (60A, 60B) and having an areal overlap with each of the electrodes (60A, 60B). Unmasked portions of the optional sacrificial cover material layer 43L, the PCM-capping dielectric layer 42L, and the PCM layer 40L may be etched by performing an anisotropic etch process that uses the patterned photoresist material portion as an etch mask. A remaining portion of the PCM-capping dielectric layer 42L comprises a PCM-capping dielectric plate 42. A remaining portion of the PCM layer 40L comprises a phase change material line 40, which is also referred to as a PCM line 40. Any remaining portion of the optional sacrificial cover material layer 43L may be removed by performing an etch process (such as an isotropic etch process) that etches the material of the sacrificial cover material layer 43L selective to the materials of the PCM-capping dielectric plate 42 and the PCM line 40. For example, a wet etch process using hydrofluoric acid may be used in embodiments in which the sacrificial cover material layer 43L comprises undoped silicate glass or a doped silicate glass.

Generally, the phase change material (PCM) line 40 is formed over the insulating matrix layer 26. A first end portion of the PCM line 40 contacts a top surface of the first electrode 60A, and a second end portion of the PCM line 40 contacts a top surface of the second electrode 60B. A middle portion of the PCM line may contact the top surface of the insulating matrix layer 26. A first segment of the top surface of the first electrode 60A contacts a first end portion of the bottom surface of the PCM line 40, and a second segment of the top surface of the first electrode 60A is physically exposed. A first segment of the top surface of the second electrode 60B contacts a second end portion of the bottom surface of the PCM line 40, and a second segment of the top surface of the second electrode 60B is physically exposed.

Figure 13A:
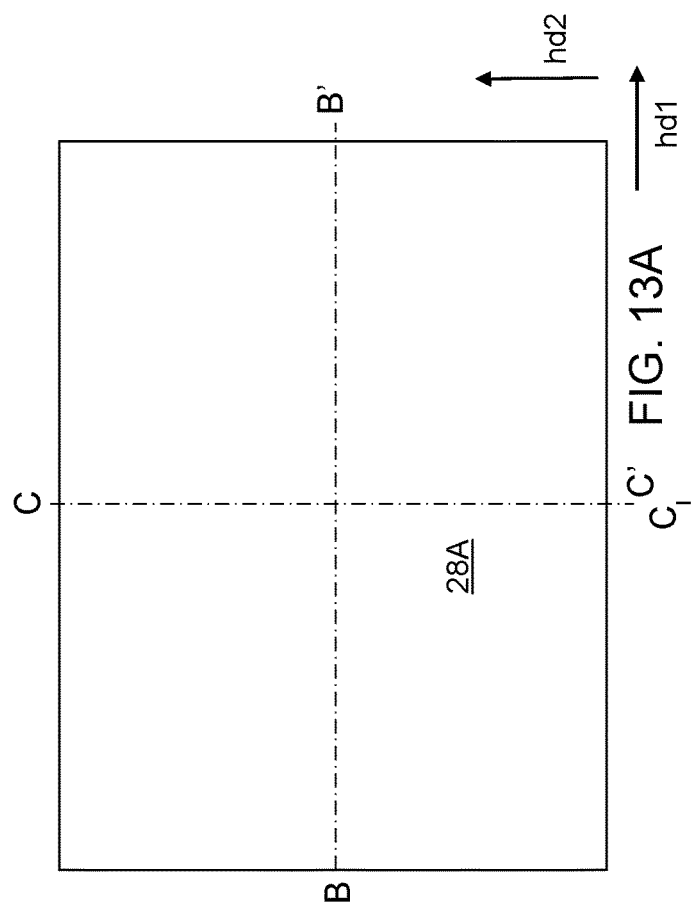
FIGS. 13A-13C are various views of the second exemplary structure after formation of a dielectric encapsulation layer and a lower contact-level dielectric layer according to the second embodiment of the present disclosure.
Figure 13C:
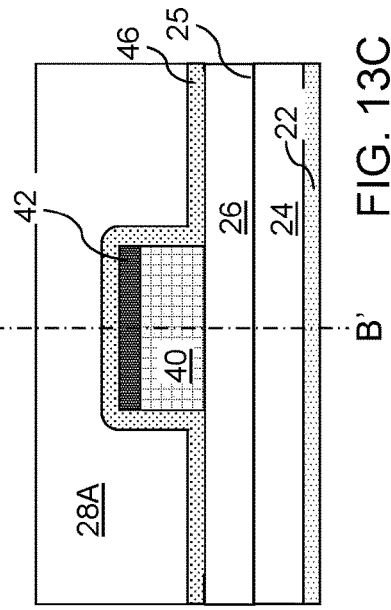
Figure 13B:
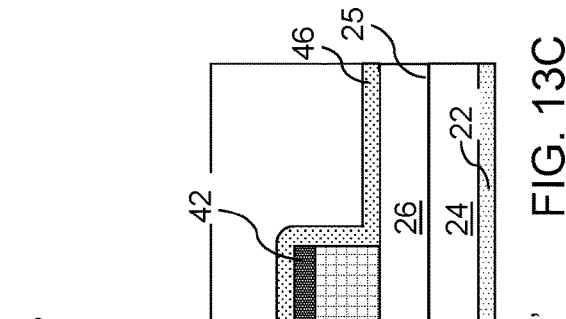

Referring to FIGS. 13A-13C, a dielectric encapsulation layer 46 may be formed by conformal deposition of a dielectric encapsulation material. The dielectric encapsulation material may comprise a passivation dielectric material that may be used to prevent or suppress reaction of the phase change material in the PCM line 40 with adjacent material portions. In one embodiment, the dielectric encapsulation layer 46 may comprise a dielectric nitride material such as silicon nitride or silicon carbide nitride. In one embodiment, the dielectric encapsulation layer 46 may comprises silicon atoms at an atomic percentage less than 50%, the balance of the atomic percentage being the atomic percentage of nitrogen and/or carbon atoms. The thickness of the dielectric encapsulation layer 46 may be uniform or substantially uniform, and the thickness of the dielectric encapsulation layer 46 may be in a range from 50 nm to 300 nm, such as from 100 nm to 200 nm, although lesser and greater thicknesses may also be used.

As discussed above, damage to the PCM material may induce compositional variations in the damaged portion of the PCM material, and may cause variations in the resistance across the first electrode 60A and the second electrode 60B while the PCM line is in the low resistivity state (i.e., the "on-state"). According to an aspect of the present disclosure, the dielectric encapsulation layer 46 may be used to mitigate against damages to the PCM material in the PCM line 40 during subsequent processing steps.

Specifically, the dielectric encapsulation layer 46 encapsulates the PCM material of the PCM line 40 from above and at all sidewalls of the PCM line 40. In one embodiment, the dielectric encapsulation layer 46 contacts the entirety of the top surface of the PCM-capping dielectric plate 42. The dielectric encapsulation layer 46 covers the entire area of the PCM line 40, and contacts the entirety of all sidewalls of the PCM line 40. The dielectric encapsulation layer 46 contacts a segment of a top surface of the first electrode 60A, a segment of a top surface of the second electrode 60B, and a top surface of the insulating matrix layer 26. A first horizontally-extending portion of the dielectric encapsulation layer 46 contacts the top surface of the PCM-capping dielectric plate 42. A bottom surface of a second horizontally-extending portion of the dielectric encapsulation layer 46 contacts the top surface of the insulating matrix layer 26 within the horizontal plane.

Subsequently, a dielectric material layer may be deposited over the encapsulation dielectric layer 46. The dielectric material layer is herein referred to as a lower dielectric material layer 28A or a first dielectric material layer. The lower dielectric material layer 28A may be planarized to provide a horizontal top surface. The vertical distance between the horizontal plane including the top surface of the lower dielectric material layer 28A and the top surface of the first horizontally-extending portion of the dielectric encapsulation layer 46 may be in a range from 50 nm to 300 nm, such as from 100 nm to 200 nm, although lesser and greater vertical distances may also be used.

Referring to FIGS. 14A-14C, a photoresist layer (not shown) may be applied over the lower dielectric material layer 28A, and may be lithographically patterned to form an opening over a middle portion of the PCM line 40. In one embodiment, the opening in the photoresist layer may be elongated along the second horizontal direction hd2. In one embodiment, the dimension of the opening along the second horizontal direction hd2 may be greater than the lateral distance between a pair of outer sidewalls of the dielectric encapsulation layer 46 that laterally extends along the first horizontal direction hd1 and contacts a respective sidewall of the lower dielectric material layer 28A.

An anisotropic etch process may be performed to etch portions of the lower dielectric material layer 28A that are not covered by the patterned photoresist layer. The dielectric encapsulation layer 46 may be used as an etch stop layer for the anisotropic etch process. A trench 59 may be formed in a volume from which the material of the lower dielectric material layer 28A is removed. The bottom surface of the trench 59 may comprise a surface segment of the dielectric encapsulation layer 46 and two surface segments of the lower dielectric material layer 28A that are formed by removal of an upper portion of the lower dielectric material layer 28A. The physically exposed surface segment of the dielectric encapsulation layer 46 comprises a top surface of the first horizontally-extending portion of the dielectric encapsulation layer 46 that overlies the PCM line 40.

Figure 15C:
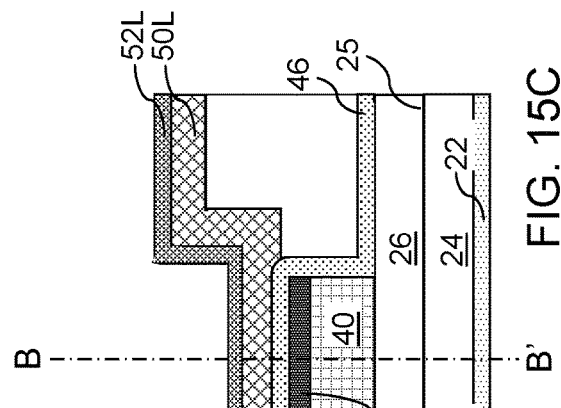
FIGS. 15A-15C are various views of the second exemplary structure after formation of a conductive material layer and a dielectric capping material layer according to the second embodiment of the present disclosure.
Figure 15A:
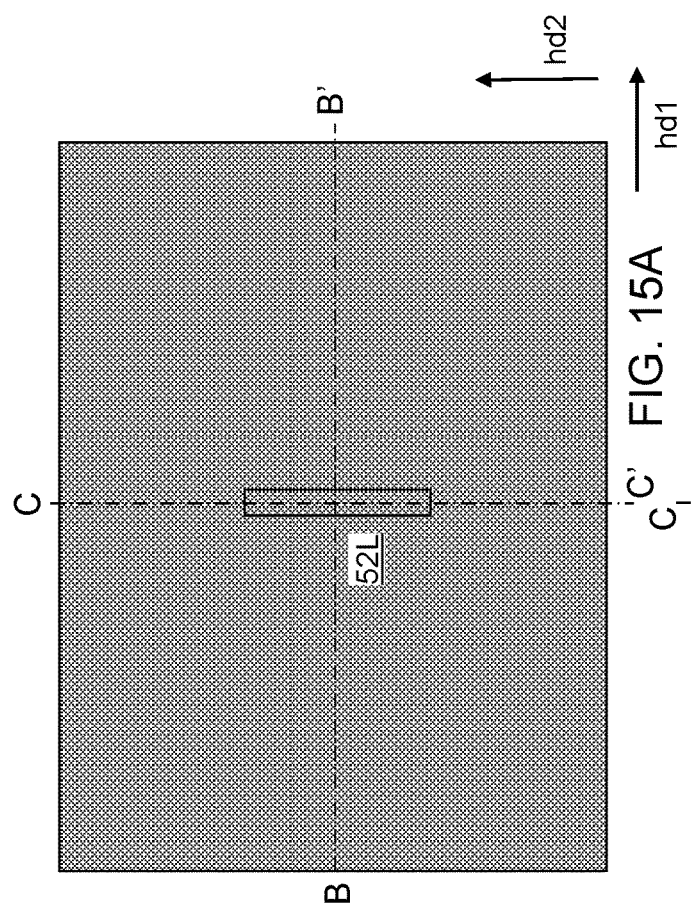
Figure 15B:
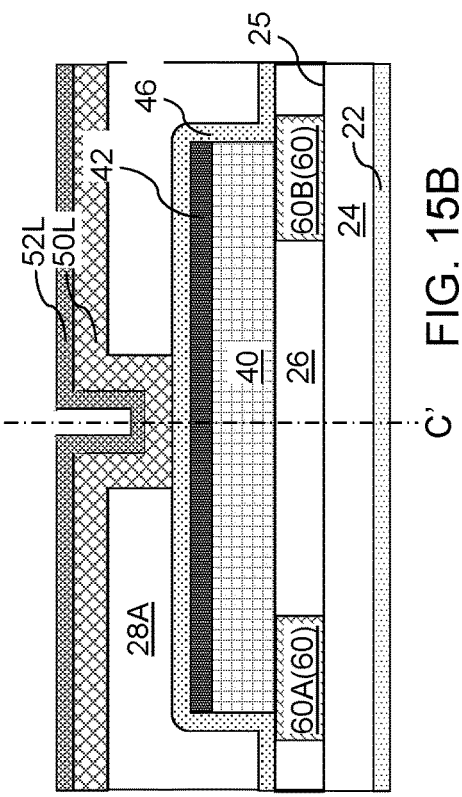

Referring to FIGS. 15A-15C, a conductive material layer 50L and a heater-capping dielectric layer 52L may be sequentially deposited in the trench 59 and over the top surface of the lower dielectric material layer 28A. In one embodiment, the conductive material layer 50L may be a metallic material layer. The conductive material layer 50L includes a metallic material having a lower electrical conductivity than copper or aluminum. The conductive material layer 50L may comprise a refractory elemental metal such as tungsten, rhenium, tantalum, molybdenum, or niobium, or may comprises a conductive metallic nitride material such as tungsten nitride, titanium nitride, or tantalum nitride. Other suitable conductive materials are within the contemplated scope of disclosure. The thickness of the conductive material layer 50L may be in a range from 50 nm to 300 nm, such as from 100 nm to 200 nm, although lesser and greater thicknesses may also be used. The heater-capping dielectric layer 52L comprises a dielectric material such as silicon nitride, silicon carbide, silicon carbide nitride, or a dielectric metal oxide such as aluminum oxide, hafnium oxide, tantalum oxide, yttrium oxide, or lanthanum oxide. Other suitable dielectric materials are within the contemplated scope of disclosure. The thickness of the heater-capping dielectric layer 52L may be in a range from 20 nm to 100 nm, such as from 30 nm to 60 nm, although lesser and greater thicknesses may also be used.

Figure 16C:
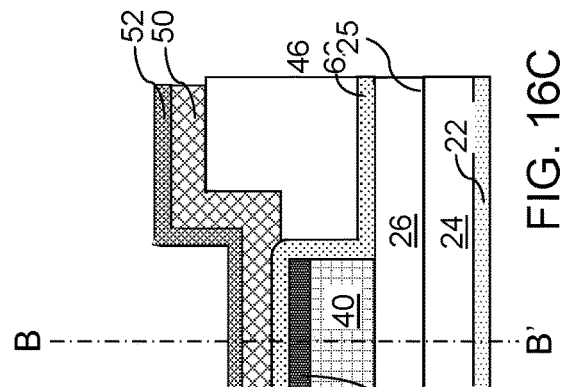
FIGS. 16A-16C are various views of the second exemplary structure after formation of a heater-capping dielectric plate and a heater line according to the second embodiment of the present disclosure.
Figure 16A:
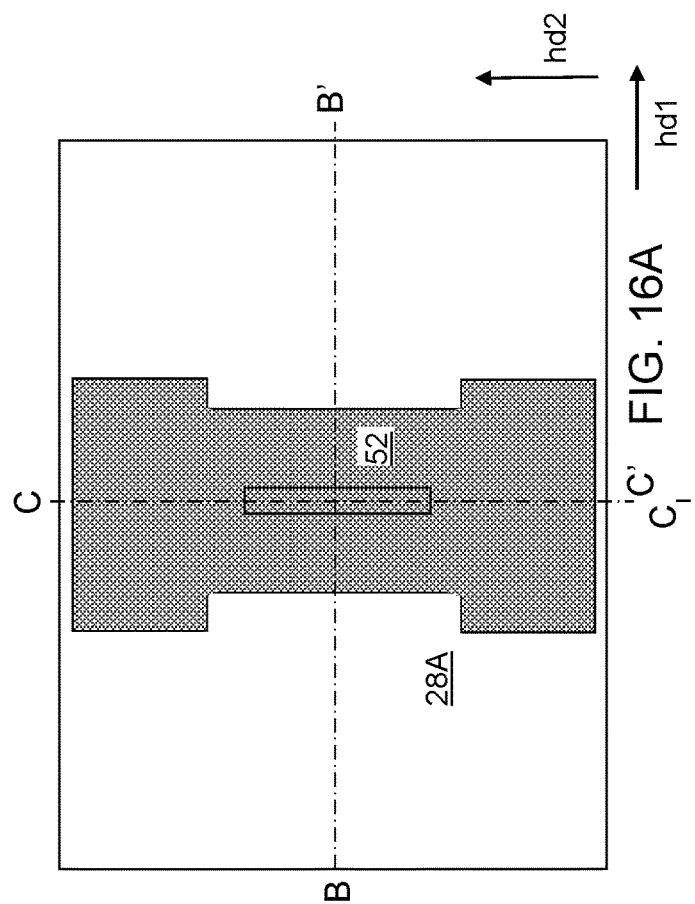
Figure 16B:
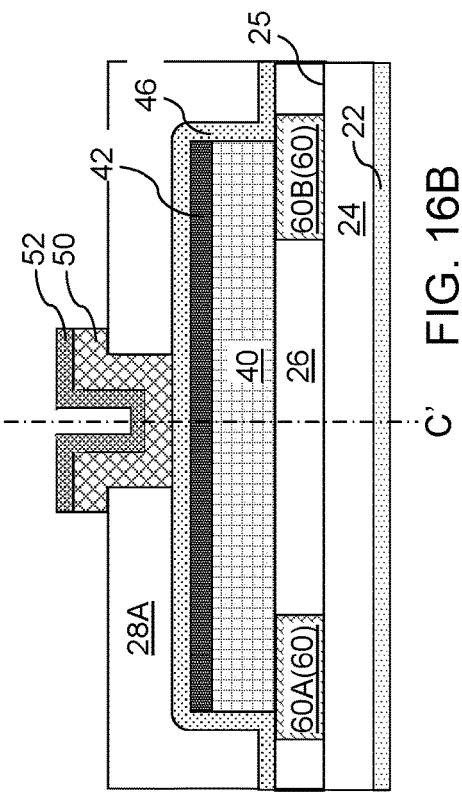

Referring to FIGS. 16A-16C, a photoresist layer (not shown) may be applied over the heater-capping dielectric layer 52L. The photoresist layer may be lithographically patterned to form a discrete photoresist material portion that covers an area that straddles the PCM line 40. In one embodiment, the area of the discrete photoresist material portion may include the entirety of the area of the trench 59, and may additionally include areas adjacent to the trench 59.

In one embodiment, the area of the discrete photoresist material portion may include additional areas that are laterally offset from the area of the trench 59 along the lengthwise direction of the trench 59, such as the second horizontal direction hd2. An anisotropic etch process may be performed to remove portions of the heater-capping dielectric layer 52L and the conductive material layer 50L that are not covered by the patterned photoresist material portion. A remaining portion of the heater-capping dielectric layer 52L comprises a heater-capping dielectric plate 52. A remaining portion of the conductive material layer 50L may include a heater line 50. In the second embodiment, the heater line 50 may be formed after formation of the PCM line 40 directly on a top surface of a horizontally-extending portion of the dielectric encapsulation layer 46 that overlies the PCM line 40. In one embodiment, the heater line 50 contacts a top surface of a first horizontally-extending portion of the dielectric encapsulation layer 46 that overlies the PCM line 40, and a lower dielectric material layer 28A overlying the dielectric encapsulation layer 46 and laterally surrounding the PCM line 40 and a lower portion of the heater line 50. The photoresist layer may be subsequently removed, for example, by ashing.

Referring to FIGS. 17A-17D, a dielectric material layer may be deposited over the heater-capping dielectric plate 52 and the heater line 50. The dielectric material layer is herein referred to as an upper dielectric material layer 28B. The thickness of the upper dielectric material layer 28B may be in a range from 100 nm to 600 nm, such as from 200 nm to 300 nm, although lesser and greater thicknesses may also be used. The combination of the lower dielectric material layer 28A and the upper dielectric material layer 28B constitutes a switch-level dielectric material layer 28. Additional metal interconnect structures (652, 658) may be formed in the switch-level dielectric material layer 28. The additional metal interconnect structures (652, 658) are herein referred to as switch-level metal interconnect structures (652, 658), and may comprise switch-level metal line structures 658 and switch-level metal via structures 652.

The switch-level metal via structures 652 may comprise a first electrode contact via structure 6521 contacting the first electrode 60A, a second electrode contact via structure 6522 contacting the second electrode 60B, a first heater contact via structure 6523 contacting a first end portion of the heater line 50, and a second heater contact via structure 6524 contacting a second end portion of the heater line 50. The switch-level metal line structures 658 may comprise a first electrode connection metal line structure 6581 contacting a top surface of the first electrode contact via structure 6521, a second electrode connection metal line structure 6582 contacting a top surface of the second electrode contact via structure 6522, a first heater connection metal line structure 6583 contacting a top surface of the first heater contact via structure 6523, and a second heater connection metal line structure 6584 contacting a top surface of the second heater contact via structure 6524.

Generally, semiconductor devices 701 may be formed on the substrate 8, and metal interconnect structures (612, 618, 622, 628, 632, 638, 642, 648) and dielectric material layers (601, 610, 620, 630, 640) may be formed over the substrate 8. The metal interconnect structures (612, 618, 622, 628, 632, 638, 642, 648) are formed in the dielectric material layers (601, 610, 620, 630, 640). The dielectric isolation layer 24 is formed over metal interconnect structures (612, 618, 622, 628, 632, 638, 642, 648).

The first electrode contact via structure 6521 may contact a top surface of the first electrode 60A and a cylindrical sidewall of a first opening through the encapsulation dielectric layer 46. The second electrode contact via structure 6522 may contact a top surface of the second electrode 60B and a cylindrical sidewall of a second opening through the encapsulation dielectric layer 46. The first heater contact via structure 6523 may contact a top surface of a first end portion of the heater line 50, and may contact a first sidewall of the heater-capping dielectric plate 52. The second heater contact via structure 6524 may contact a top surface of a second end portion of the heater line 50, and may contact a second sidewall of the heater-capping dielectric plate 52.

The two end portions of the heater line 50, the first electrode 60A, and the second electrode 60B may be electrically connected to a respective one of the metal interconnect structures (612, 618, 622, 628, 632, 638, 642, 648) by forming additional metal interconnect structures (652, 658), which include additional switch-level metal via structures (not illustrated) that connect a respective one of the switch-level metal line structures 658 to a respective one of the fourth metal line structures 648.

Referring to FIGS. 18A-18C, a third exemplary structure according to a third embodiment of the present disclosure may be the same as the second exemplary structure illustrated in FIGS. 2A-2C, or may be derived from the first exemplary structure illustrated in FIGS. 2A and 2B by modifying the horizontal cross-sectional shapes of at least one of the first electrode 60A and the second electrode 60B. In embodiments in which the shapes of the first electrode 60A and the second electrode 60B are modified, the modification may be made in a manner that facilitates formation of electrode contact via structures in subsequent processing steps. The heater line 30 in the third exemplary structure is hereafter referred to as a first heater line 30.

Referring to FIGS. 19A-19C, the processing steps of FIGS. 3A-3C may be performed to form an insulating matrix layer 26. The top surfaces of the first electrode-capping dielectric plate 62A, the second electrode-capping dielectric plate 62B, and the heater-capping dielectric plate 32 may be located within a same horizontal plane as the top surface of the insulating matrix layer 26. The heater-capping dielectric plate 32 is hereafter referred to as a first heater-capping dielectric plate 32.

Referring to FIGS. 20A-20C, the processing steps of FIGS. 4A-4C may be performed to remove segments of the first electrode-capping dielectric plate 62A and the second electrode-capping dielectric plate 62B, and to physically expose a first segment of the top surface of the first electrode 60A and a first segment of the top surface of the second electrode 60B.

Figure 21C:
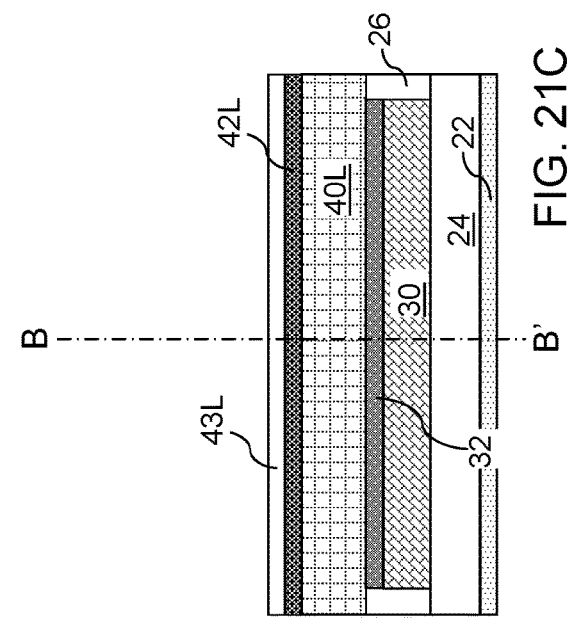
FIGS. 21A-21C are various views of the third exemplary structure after formation of a phase change material layer, a PCM-capping dielectric layer, and a sacrificial cover material layer according to the third embodiment of the present disclosure.
Figure 21A:
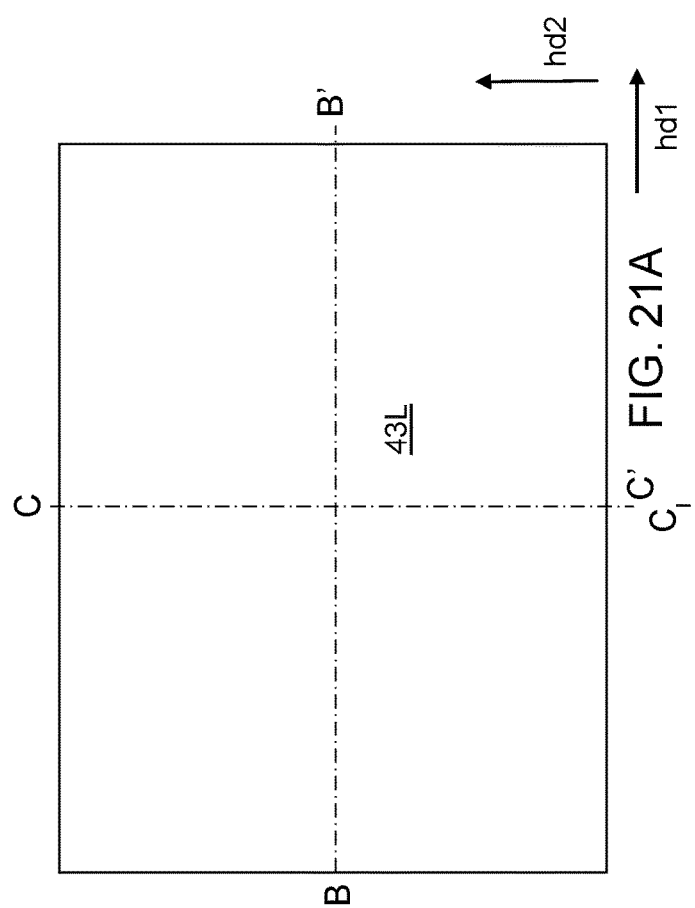
Figure 21B:
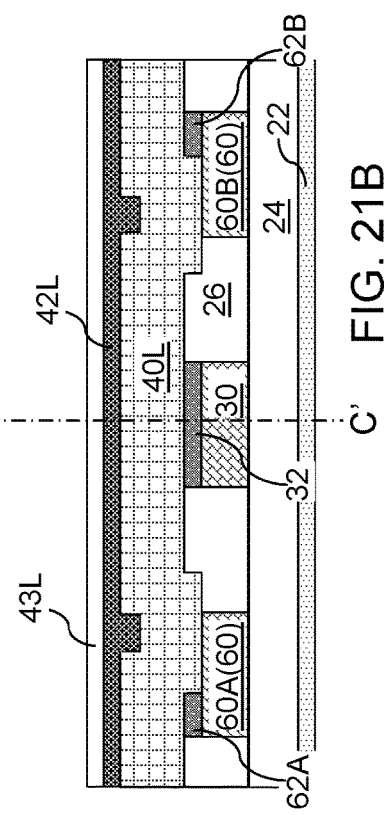

Referring to FIGS. 21A-21C, the processing steps of FIGS. 5A-5C may be performed to form a stack of a PCM material layer 40L, a PCM-capping dielectric layer 42L, and an optional sacrificial cover material layer 43L.

Figure 22C:
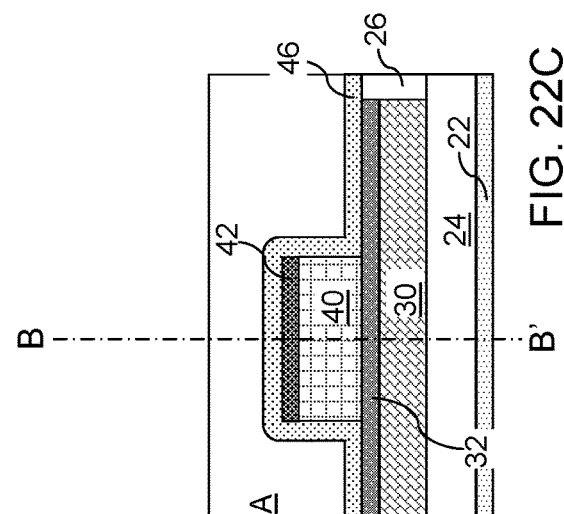
FIGS. 22A-22C are various views of the third exemplary structure after formation of a PCM-capping dielectric plate, and a phase change material (PCM) line, a dielectric encapsulation layer, a lower contact-level dielectric layer, and additional metal interconnect structures according to the third embodiment of the present disclosure.
Figure 22A:
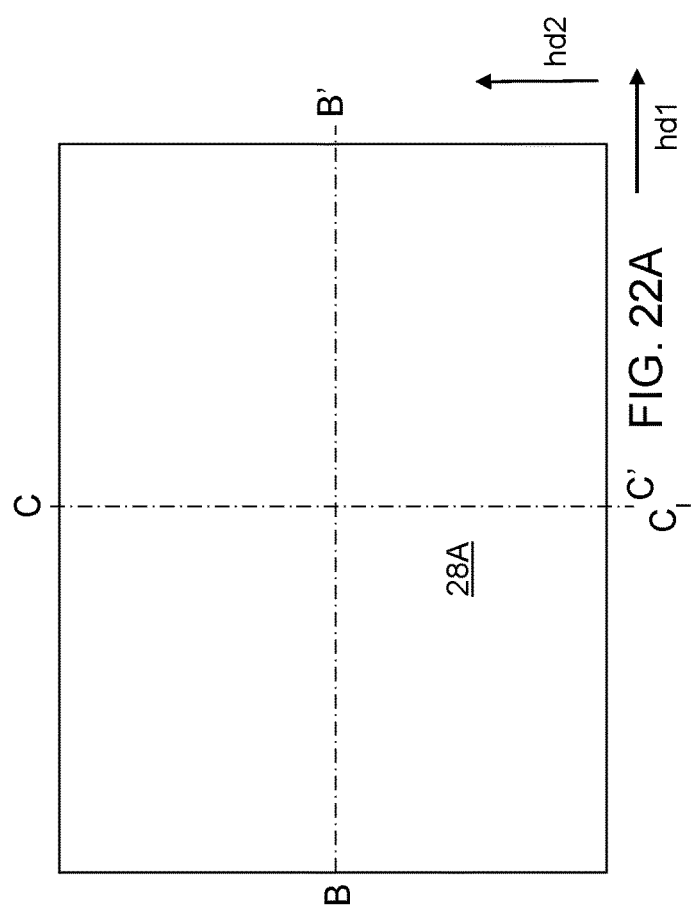
Figure 22B:
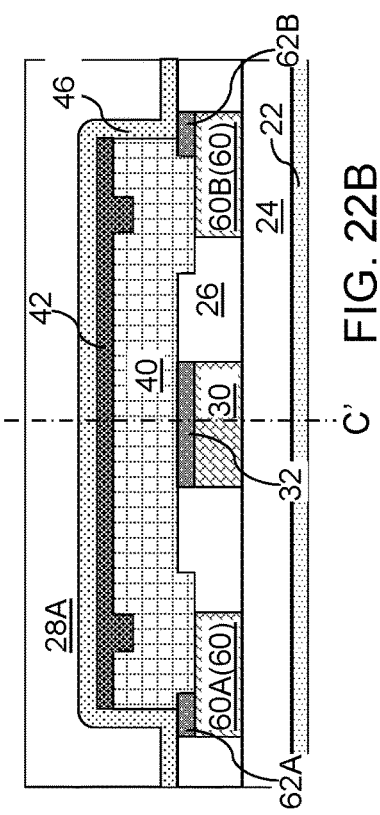
Figure 26D:
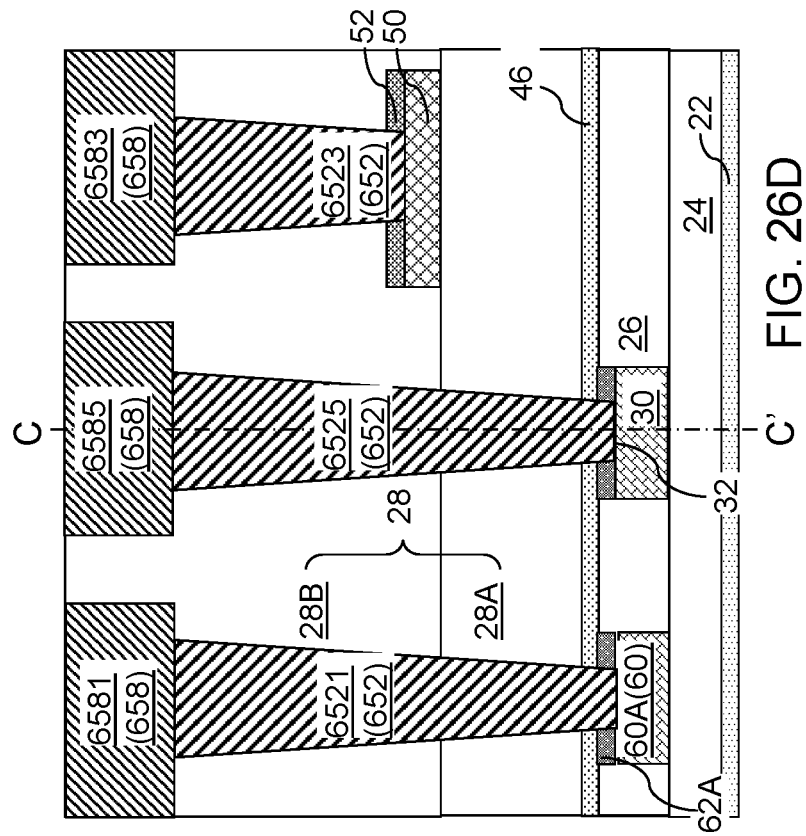
Figure 26B:
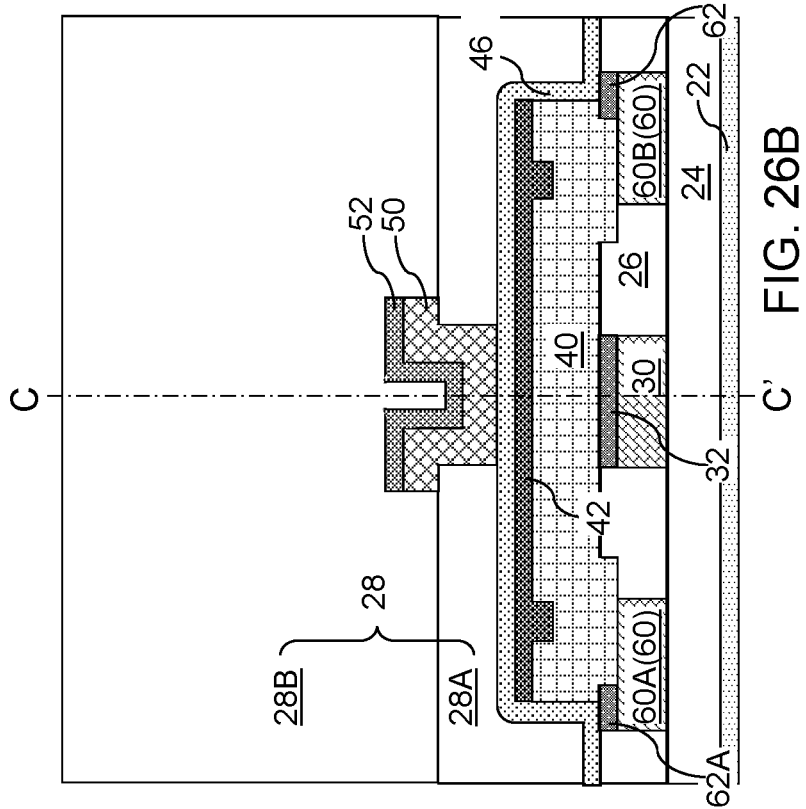

Referring to FIGS. 22A-22C, the processing steps of FIGS. 6A-6C may be performed to pattern the PCM-capping dielectric layer 42L and the PCM material layer 40L. A stack of a PCM line 40 and a PCM-capping dielectric plate 42 is formed. The optional sacrificial cover material layer 43L, if used, may be removed after patterning the PMC line 40 and the PCM-capping dielectric plate 42. The PCM line 40 is formed over the insulating matrix layer 26. A first end portion of the PCM line 40 contacts a first segment of a top surface of the first electrode 60A, and a second end portion of the PCM line 40 contacts a second segment of the top surface of the second electrode 60B. The first heater line 30 is formed prior to formation of the PCM line 40, and underlies the PCM line 40. The insulating matrix layer 26 laterally surrounds the first heater line 30, the first electrode 60A, the second electrode 60B, the first electrode-capping dielectric plate 62A, the second electrode-capping dielectric plate 62B, a first downward-protruding portion of the PCM line 40 that contacts the first electrode 60A, and a second downward-protruding portion of the PCM line 40 that contacts the second electrode 60B.

Subsequently, the processing steps of FIGS. 13A-13C may be performed to form a dielectric encapsulation layer 46 and a lower dielectric material layer 28A. The dielectric encapsulation layer 46 is formed on sidewalls of the PCM line 40 and over the entire area of the PCM line 40 and over a top surface of the insulating matrix layer 26. As discussed above, the dielectric encapsulation layer 46 provide protection for the PCM material during subsequent processing steps. The dielectric encapsulation layer 46 contacts a segment of a top surface of the first electrode-capping dielectric plate 62A, a segment of a top surface of the second electrode-capping dielectric plate 62B, and two segments of a top surface of the first heater-capping dielectric plate 32. The lower dielectric material layer 28A overlies the dielectric encapsulation layer 46, and laterally surrounds the PCM line 40.

Referring to FIGS. 23A-23C, the processing steps of FIGS. 14A-14C may be performed to form a heater trench 59. The bottom surface of the trench 59 may comprise a surface segment (i.e., a top surface of a horizontally-extending portion) of the dielectric encapsulation layer 46 and two surface segments of the lower dielectric material layer 28A that are formed by removal of an upper portion of the lower dielectric material layer 28A. The physically exposed surface segment of the dielectric encapsulation layer 46 comprises a top surface of the first horizontally-extending portion of the dielectric encapsulation layer 46 that overlies the PCM line 40.

Referring to FIGS. 24A-24C, the processing steps of FIGS. 15A-15C may be performed to form a conductive material layer 50L and a heater-capping dielectric layer 52L. The conductive material layer 50L may be a metallic material layer, and may have the same material composition and the same thickness range as in the second exemplary structure. Likewise, the heater-capping dielectric layer 52L may have the same material composition and the same thickness range as in the second exemplary structure. The conductive material layer 50L is also referred to as a heater material layer.

Referring to FIGS. 25A-25C, the processing steps of FIGS. 16A-16C may be performed to pattern the heater-capping dielectric layer 52L and the conductive material layer 50L. A patterned portion of the heater-capping dielectric layer 52L comprises a heater-capping dielectric plate 52. A patterned portion of the conductive material layer comprises a second heater line 50. The pattern of the second heater line 50 may be the same as, or may be modified from, the pattern of the heater line 50 in the second exemplary structure. If modified, the modifications in the shape of the second heater line 50 may be made in a manner that facilitates formation of heater contact via structures in subsequent processing steps.

The second heater line 50 may be formed after formation of the dielectric encapsulation layer 46 directly on a horizontally-extending portion of the dielectric encapsulation layer 46 that overlies the PCM line 40. The lower dielectric material layer 28A laterally surrounds the PCM line 40 and a lower portion of the heater line 50.

Referring to FIGS. 26A-26E, the processing steps of FIGS. 17A-17D may be performed mutatis mutandis to form an upper dielectric material layer 28B and additional metal interconnect structures (652, 658). The modifications may include formation of additional heater contact via structures (6525, 6526) and additional heater connection metal line structures (6585, 6586) that are used to provide electrical contact to the first heater line 30. Generally, the layout of the additional metal interconnect structures (652, 658) may be optimized as needed to provide electrical contact to each of the first electrode 60A, the second electrode 60B, two ends of the first heater line 30, and two ends of the second heater line 50.

The additional metal interconnect structures (652, 658) may comprise switch-level metal via structures 652 and switch-level metal line structures 658. The switch-level metal via structures 652 may comprise a first electrode contact via structure 6521 contacting the first electrode 60A, a second electrode contact via structure 6522 contacting the second electrode 60B, a first heater contact via structure 6523 contacting a first end portion of the second heater line 50, and a second heater contact via structure 6524 contacting a second end portion of the second heater line 50, a third heater contact via structure 6525 contacting a first end portion of the first heater line 30, and a fourth heater contact via structure 6526 contacting a second end portion of the first heater line 30. The switch-level metal line structures 658 may comprise a first electrode connection metal line structure 6581 contacting a top surface of the first electrode contact via structure 6521, a second electrode connection metal line structure 6582 contacting a top surface of the second electrode contact via structure 6522, a first heater connection metal line structure 6583 contacting a top surface of the first heater contact via structure 6523, a second heater connection metal line structure 6584 contacting a top surface of the second heater contact via structure 6524, a third heater connection metal line structure 6585 contacting a top surface of the third heater contact via structure 6525, and a fourth heater connection metal line structure 6586 contacting a top surface of the fourth heater contact via structure 6526.

Generally, semiconductor devices 701 may be formed on the substrate 8, and metal interconnect structures (612, 618, 622, 628, 632, 638, 642, 648) and dielectric material layers (601, 610, 620, 630, 640) may be formed over the substrate 8. The metal interconnect structures (612, 618, 622, 628, 632, 638, 642, 648) are formed in the dielectric material layers (601, 610, 620, 630, 640). The dielectric isolation layer 24 is formed over metal interconnect structures (612, 618, 622, 628, 632, 638, 642, 648).

The first electrode contact via structure 6521 may contact a top surface of the first electrode 60A, a sidewall of the first electrode-capping dielectric plate 62A, and a cylindrical sidewall of a first opening through the encapsulation dielectric layer 46. The second electrode contact via structure 6522 may contact a top surface of the second electrode 60B, a sidewall of the second electrode-capping dielectric plate 62B, and a cylindrical sidewall of a second opening through the encapsulation dielectric layer 46. The first heater contact via structure 6523 may contact a top surface of a first end portion of the heater line 50, and may contact a first sidewall of the second heater-capping dielectric plate 52. The second heater contact via structure 6524 may contact a top surface of a second end portion of the heater line 50, and may contact a second sidewall of the second heater-capping dielectric plate 52. The third heater contact via structure 6525 may contact a top surface of a first end portion of the first heater line 30, a sidewall of the first heater-capping dielectric plate 32, and a cylindrical sidewall of a third opening through the encapsulation dielectric layer 46. The fourth heater contact via structure 6526 may contact a top surface of a second end portion of the first heater line 30, a sidewall of the first heater-capping dielectric plate 32, and a cylindrical sidewall of a fourth opening through the encapsulation dielectric layer 46.

The two end portions of the first heater line 30, the two end portions of the second heater line 50, the first electrode 60A, and the second electrode 60B may be electrically connected to a respective one of the metal interconnect structures (612, 618, 622, 628, 632, 638, 642, 648) by forming additional metal interconnect structures (652, 658), which include additional switch-level metal via structures (not illustrated) that connect a respective one of the switch-level metal line structures 658 to a respective one of the fourth metal line structures 648.

Figure 27:
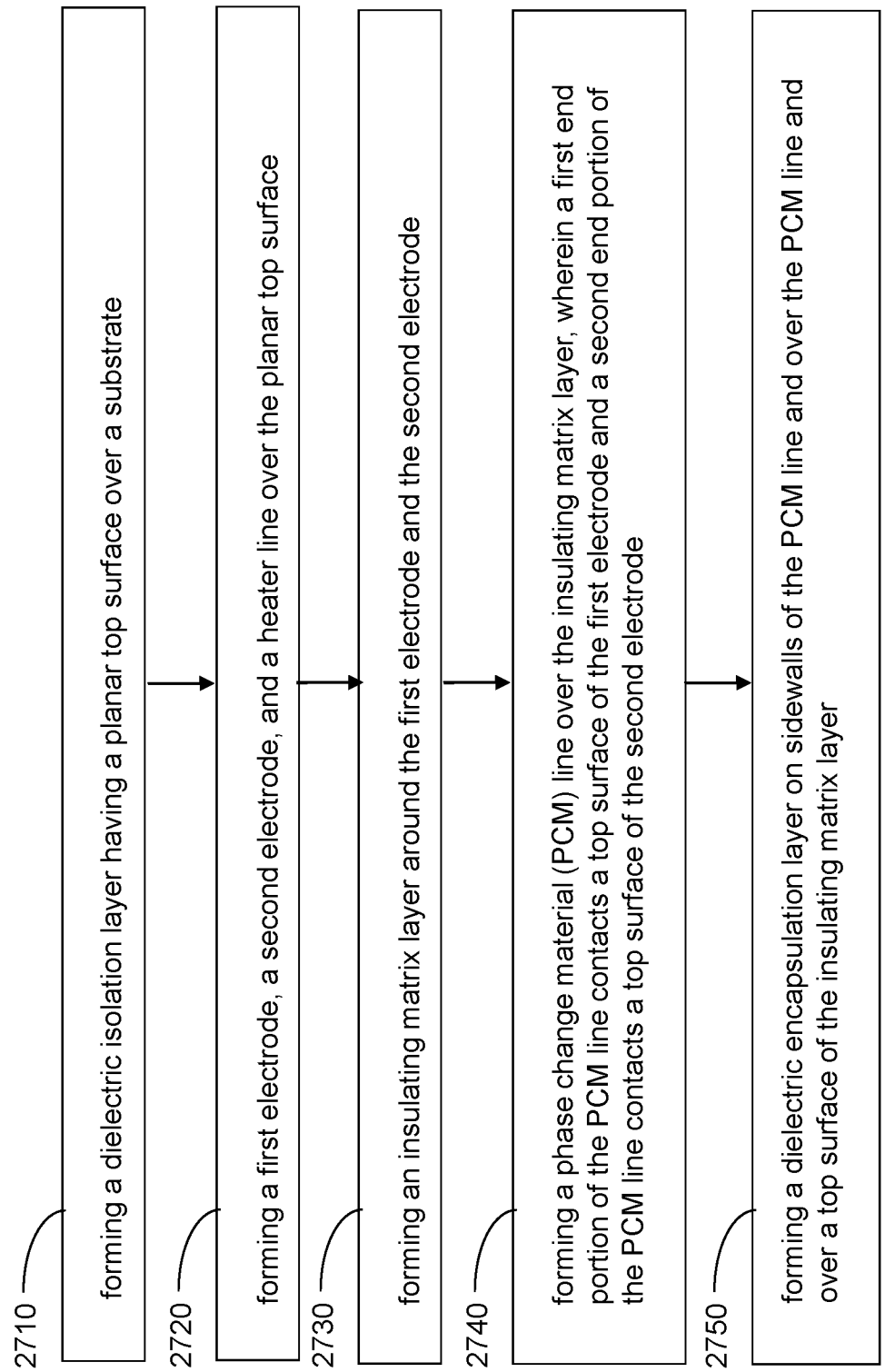
FIG. 27 is a first flowchart that illustrates the general processing steps for manufacturing the semiconductor devices according to some embodiments of the present disclosure.

Referring to FIG. 27, a first flowchart illustrates the general processing steps for manufacturing the semiconductor devices according to some embodiments of the present disclosure.

Referring to step 2710 and FIGS. 1 and 18A-18C, a dielectric isolation layer 24 having a planar top surface 25 may be formed over a substrate 8.

Referring to step 2720 and FIGS. 2A-2C and 18A-18C, a first electrode 60A, a second electrode 60B, and a heater line 30 may be formed over the planar top surface 25.

Referring to step 2730 and FIGS. 3A-3C and 19A-19C, an insulating matrix layer 26 may be formed around the first electrode 60A and the second electrode 60B.

Referring to step 2740 and FIGS. 4A-6C and 20A-22C, a phase change material (PCM) line 40 may be formed over the insulating matrix layer 26. A first end portion of the PCM line 40 contacts a top surface of the first electrode 60A, and a second end portion of the PCM line 40 contacts a top surface of the second electrode 60B.

Referring to step 2750 and FIGS. 7A-7D and 22A-26E, a dielectric encapsulation layer 46 may be formed on sidewalls of the PCM line 40 and over the PCM line 40 and over a top surface of the insulating matrix layer 26.

Figure 28:
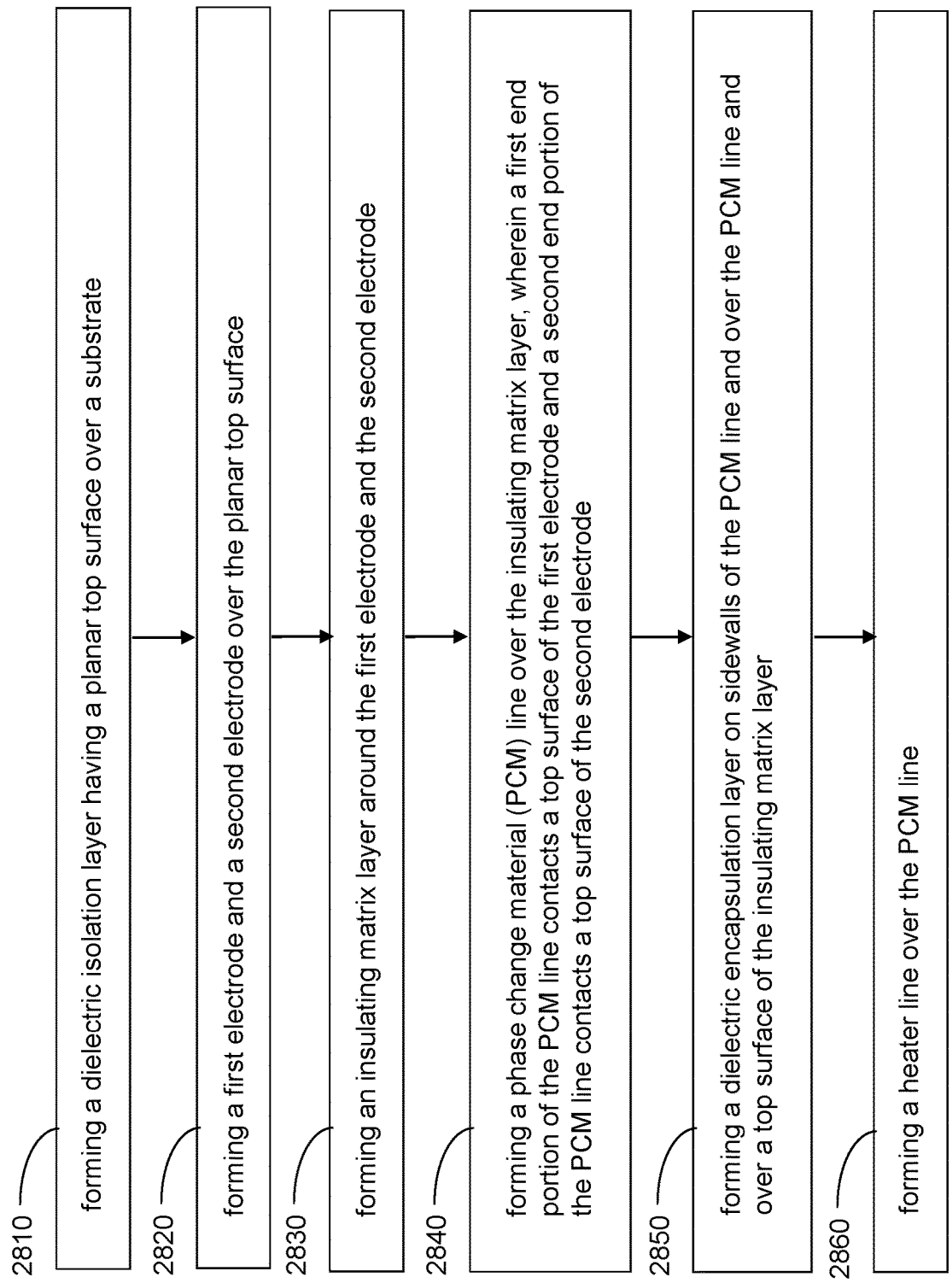
FIG. 28 is a second flowchart that illustrates the general processing steps for manufacturing the semiconductor devices according to some embodiments of the present disclosure.

Referring to FIG. 28, a second flowchart illustrates the general processing steps for manufacturing the semiconductor devices according to some embodiments of the present disclosure.

Referring to step 2810 and FIGS. 1, 9A-9C, and 18A-18C, a dielectric isolation layer 24 having a planar top surface 25 may be formed over a substrate 8.

Referring to step 2820 and FIGS. 9A-9C and 18A-18C, a first electrode 60A and a second electrode 60B may be formed over the planar top surface 25.

Referring to step 2830 and FIGS. 10A-10C and 19A-19C, an insulating matrix layer 26 may be formed around the first electrode 60A and the second electrode 60B.

Referring to step 2840 and FIGS. 11A-12C and 20A-22C, a phase change material (PCM) line 40 may be formed over the insulating matrix layer 26. A first end portion of the PCM line 40 contacts a top surface of the first electrode 60A, and a second end portion of the PCM line 40 contacts a top surface of the second electrode 60B.

Referring to step 2850 and FIGS. 13A-13C and 22A-22C, a dielectric encapsulation layer 46 may be formed on sidewalls of the PCM line 40 and over the PCM line 40 and over a top surface of the insulating matrix layer 26.

Referring to step 2860 and FIGS. 14A-17D and 22A-26E, a heater line 50 may be formed over the PCM line 40.

Referring to all drawings and according to various embodiments of the present disclosure, a semiconductor structure is provided, which comprises: a dielectric isolation layer 24 overlying a substrate 8 and comprising a planar top surface 25; a heater line 30, a first electrode 60A, and a second electrode 60B that are located on a first area, a second area, and a third area, respectively, of the planar top surface 25; a phase change material (PCM) line 40 comprising a middle portion overlying the heater line 30, a first end portion contacting a first segment of a top surface of the first electrode 60A, and a second end portion contacting a first segment of a top surface of the second electrode 60B; and a dielectric encapsulation layer 46 contacting all sidewalls of the phase change material line 40 and overlying an entirety of a top surface of the phase change material line 40.

In one embodiment, the semiconductor structure may also include a heater-capping dielectric plate 32 contacting a top surface of the heater line 30 and contacting a bottom surface of the middle portion of the PCM line 40. In one embodiment, the semiconductor structure may also include a first electrode-capping dielectric plate 62A contacting a second segment of the top surface of the first electrode 60A; and a second electrode-capping dielectric plate 62B contacting a second segment of the top surface of the second electrode 60B, wherein the first electrode-capping dielectric plate 62A and the second electrode-capping dielectric plate 62B have a same material composition and a same thickness as the heater-capping dielectric plate 32. In one embodiment, the semiconductor structure may also include an insulating matrix layer 26 laterally surrounding the heater line 30, the first electrode 60A, the second electrode 60B, the first electrode-capping dielectric plate 62A, the second electrode-capping dielectric plate 62B, a first downward-protruding portion of the PCM line 40 that contacts the first electrode 60A, and a second downward-protruding portion of the PCM line 40 that contacts the second electrode 60B. In one embodiment, the dielectric encapsulation layer 46 contacts a segment of a top surface of the first electrode-capping dielectric plate 62A, a segment of a top surface of the second electrode-capping dielectric plate 62B, and two segments of a top surface of the heater-capping dielectric plate 32. In one embodiment, the semiconductor structure may also include: a first heater contact via structure 6523 extending through a first opening in the dielectric encapsulation layer 46 and contacting a first sidewall of the heater-capping dielectric plate 32 and contacting a top surface of a first end portion of the heater line 30; and a second heater contact via structure 6524 extending through a second opening in the dielectric encapsulation layer 46 and contacting a second sidewall of the heater-capping dielectric plate 32 and contacting a top surface of a second end portion of the heater line 30. In one embodiment, the semiconductor structure may also include an additional heater line 50 contacting a top surface of a horizontally-extending portion of the dielectric encapsulation layer 46 that overlies a top surface of the PCM line 40.

According to another aspect of the present disclosure, a semiconductor structure is provided, which comprises: a dielectric isolation layer 24 overlying a substrate 8 and comprising a planar top surface 25; a first electrode 60A and a second electrode 60B located on the planar top surface 25 and laterally surrounded by an insulating matrix layer 26; a phase change material (PCM) line 40 comprising a middle portion overlying the heater line 30, a first end portion contacting a top surface of the first electrode 60A, and a second end portion contacting a top surface of the second electrode 60B; a dielectric encapsulation layer 46 contacting all sidewalls of the phase change material line 40 and overlying an entirety of a top surface of the phase change material line 40; and a heater line 50 contacting a top surface of a first horizontally-extending portion of the dielectric encapsulation layer 46 that overlies the PCM line 40.

In one embodiment, the semiconductor structure may also include an insulating matrix layer 26 laterally surrounding the first electrode 60A and the second electrode 60B, wherein the top surface of the first electrode 60A and the top surface of the second electrode 60B are located within a horizontal plane including a top surface of the insulating matrix layer 26. In one embodiment, a bottom surface of a second horizontally-extending portion of the dielectric encapsulation layer 46 contacts the top surface of the insulating matrix layer 26 within the horizontal plane. In one embodiment, the semiconductor structure may also include a phase-change-material-capping (PCM-capping) dielectric plate 42L contacting a top surface of the PCM line 40 and having a same area as the PCM line 40, wherein the first horizontally-extending portion of the dielectric encapsulation layer 46 overlies the PCM-capping dielectric plate 42L. In one embodiment, the semiconductor structure may also include: a dielectric material layer (601, 610, 620, 630, 640) overlying the dielectric encapsulation layer 46 and laterally surrounding the PCM line 40 and the heater line 30; a first electrode contact via structure 6521 vertically extending through the dielectric material layer (601, 610, 620, 630, 640) and the dielectric encapsulation layer 46 and contacting the top surface of the first electrode 60A; a second electrode contact via structure 6522 vertically extending through the dielectric material layer (601, 610, 620, 630, 640) and the dielectric encapsulation layer 46 and contacting the top surface of the second electrode 60B; a first heater contact via structure 6523 vertically extending through the dielectric material layer (601, 610, 620, 630, 640) and contacting a top surface of a first end portion of the heater line 30; and a second heater contact via structure 6524 vertically extending through the dielectric material layer (601, 610, 620, 630, 640) and contacting a top surface of a second end portion of the heater line 50. In one embodiment, the semiconductor structure may also include an additional heater line 50 underlying the middle portion of the PCM line 40 and located between the first electrode 60A and the second electrode 60B. In one embodiment, the semiconductor structure may also include: semiconductor devices 701 located on the substrate 8; and metal interconnect structures (612, 618, 622, 628, 632, 638, 642, 648) located within dielectric material layers (601, 610, 620, 630, 640) that overlie the substrate 8 and underlie the dielectric isolation layer 24, wherein the heater line 30, the first electrode 60A, and the second electrode 60B are electrically connected to a respective one of the metal interconnect structures (612, 618, 622, 628, 632, 638, 642, 648).

The phase change material devices of the present disclosure may be used as a phase change material (PCM) switch device, which may provide at least two different resistive states between the first electrode 60A and the second electrode 60B depending on the rate of the cooling rate of the phase change material during a programming process. In a first part of a programming process, sufficient electrical current may flow through the heater to raise the temperature of a middle portion of the PCM line 40 close to the melting point of the PCM material within the PCM line 40. In a second part of the programming process, the rate of decrease in the electrical current may be selected either to induce crystallization of the PCM material in the middle portion of the PCM line 40, or to induce amorphous solidification of the PCM material in the middle portion of the PCM line 40. In embodiments in which the middle portion of the PCM line 40 is in a crystalline state, the electrical resistance between the first electrode 60A and the second electrode 60B is in a low state. In embodiments in which the middle portion of the PCM line 40 is in an amorphous state, the electrical resistance between the first electrode 60A and the second electrode 60B is in a high state. In embodiments in which the electrical resistance between the first electrode 60A and the second electrode 60B is in the low state, the PCM switch device of the present disclosure provides an on-state (i.e., a connected state) between the first electrode 60A and the second electrode 60B. In embodiments in which the electrical resistance between the first electrode 60A and the second electrode 60B is in the high state, the PCM switch device of the present disclosure provides an off-state (i.e., a disconnected state) between the first electrode 60A and the second electrode 60B.

The phase change material switches of the present disclosure may be programmed multiple times into new states as needed. The phase change material switch of the present disclosure may be used to increase, or decrease, interconnected components that are arranged in a parallel connection. Such interconnected components may comprise capacitors, inductors, diodes, or any other passive or active semiconductor devices. The various phase change material switches of the present disclosure may be advantageously used to provide versatility in many applications including, but not limited to, radio-frequency (RF) applications, high power applications, consumer applications, and/or for mass storage applications.

The transition between the amorphous state and the crystalline state may be induced by controlling the rate of cooling after application of an electrical pulse that renders the phase change material amorphous in a first part of a programming process. The second part of the programming process includes control of the cooling rate of the phase change material. In embodiments in which rapid quenching occurs, the phase change material may cool into an amorphous high resistivity state. In embodiments in which slow cooling occurs, the phase change material may cool into a crystalline low resistivity state.

The PCM switch device of the present disclosure comprises a phase change material line 40 that is encapsulated by the dielectric encapsulation layer 46 from above on all sidewalls of the phase change material line 40. The dielectric encapsulation layer 46 protects the phase change material of the phase change material line 40 during subsequent processing steps, which may comprises formation of a passivation dielectric layer and various etch processes that patterns the passivation dielectric layer and various conducive materials for formation of bonding structures. Thus, the phase change material switch device of the present disclosure may reduce compositional variations in the phase change material, and may provide a tighter resistance distribution during the on-state of the phase change material switch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a dielectric isolation layer overlying a substrate and comprising a planar top surface;
a heater line, a first electrode, and a second electrode that are located on a first area, a second area, and a third area, respectively, of the planar top surface;
a phase change material (PCM) line comprising a middle portion overlying the heater line, a first end portion contacting a first segment of a top surface of the first electrode, and a second end portion contacting a first segment of a top surface of the second electrode;
a dielectric encapsulation layer contacting all sidewalls of the phase change material line and overlying an entirety of a top surface of the phase change material line;
a heater-capping dielectric plate contacting a top surface of the heater line and contacting a bottom surface of the middle portion of the PCM line;
a first electrode-capping dielectric plate contacting a second segment of the top surface of the first electrode; and
a second electrode-capping dielectric plate contacting a second segment of the top surface of the second electrode,
wherein the first electrode-capping dielectric plate and the second electrode-capping dielectric plate have a same material composition and a same thickness as the heater-capping dielectric plate.

2. The semiconductor structure of claim 1, further comprising an insulating matrix layer laterally surrounding the heater line, the first electrode, the second electrode, the first electrode-capping dielectric plate, the second electrode-capping dielectric plate, a first downward-protruding portion of the PCM line that contacts the first electrode, and a second downward-protruding portion of the PCM line that contacts the second electrode.

3. The semiconductor structure of claim 2, wherein the dielectric encapsulation layer contacts a segment of a top surface of the first electrode-capping dielectric plate, a segment of a top surface of the second electrode-capping dielectric plate, and two segments of a top surface of the heater-capping dielectric plate.

4. The semiconductor structure of claim 1, further comprising:
a first heater contact via structure extending through a first opening in the dielectric encapsulation layer and contacting a first sidewall of the heater-capping dielectric plate and contacting a top surface of a first end portion of the heater line; and
a second heater contact via structure extending through a second opening in the dielectric encapsulation layer and contacting a second sidewall of the heater-capping dielectric plate and contacting a top surface of a second end portion of the heater line.

5. The semiconductor structure of claim 1, further comprising an additional heater line contacting a top surface of a horizontally-extending portion of the dielectric encapsulation layer that overlies a top surface of the PCM line.

6. The semiconductor structure of claim 1, further comprising:
a dielectric material layer overlying the dielectric encapsulation layer and laterally surrounding the PCM line;
a first electrode contact via structure vertically extending through the dielectric material layer and the dielectric encapsulation layer and contacting the top surface of the first electrode; and
a second electrode contact via structure vertically extending through the dielectric material layer and the dielectric encapsulation layer and contacting the top surface of the second electrode.

7. The semiconductor structure of claim 1, further comprising:
a PCM-capping dielectric plate having sidewalls that are vertically coincident with sidewalls of the PCM line;
an additional heater line laterally extending over the PCM-capping dielectric plate and comprising a middle portion having an areal overlap with a middle portion of the heater line; and
a first dielectric material layer laterally surrounding the PCM line and the PCM-capping dielectric plate, wherein a lower portion of the additional heater line is laterally surrounded by the first dielectric material layer.

8. A semiconductor structure comprising:
a dielectric isolation layer overlying a substrate and comprising a planar top surface; a first electrode and a second electrode located on the planar top surface and laterally surrounded by an insulating matrix layer;
a phase change material (PCM) line comprising a middle portion overlying the heater line, a first end portion contacting a top surface of the first electrode, and a second end portion contacting a top surface of the second electrode;
a dielectric encapsulation layer contacting all sidewalls of the phase change material line and overlying an entirety of a top surface of the phase change material line;
a heater line contacting a top surface of a first horizontally-extending portion of the dielectric encapsulation layer that overlies the PCM line;
a dielectric material layer overlying the dielectric encapsulation layer and laterally surrounding the PCM line and the heater line;
a first electrode contact via structure vertically extending through the dielectric material layer and the dielectric encapsulation layer and contacting the top surface of the first electrode;
a second electrode contact via structure vertically extending through the dielectric material layer and the dielectric encapsulation layer and contacting the top surface of the second electrode;
a first heater contact via structure vertically extending through the dielectric material layer and contacting a top surface of a first end portion of the heater line; and
a second heater contact via structure vertically extending through the dielectric material layer and contacting a top surface of a second end portion of the heater line.

9. The semiconductor structure of claim 8, wherein the top surface of the first electrode and the top surface of the second electrode are located within a horizontal plane including a top surface of the insulating matrix layer.

10. The semiconductor structure of claim 9, wherein a bottom surface of a second horizontally-extending portion of the dielectric encapsulation layer contacts the top surface of the insulating matrix layer within the horizontal plane.

11. The semiconductor structure of claim 8, further comprising a phase-change-material-capping (PCM-capping) dielectric plate contacting a top surface of the PCM line and having a same area as the PCM line, wherein the first horizontally-extending portion of the dielectric encapsulation layer overlies the PCM-capping dielectric plate.

12. The semiconductor structure of claim 8, further comprising an additional heater line underlying the middle portion of the PCM line and located between the first electrode and the second electrode.

13. The semiconductor structure of claim 8, further comprising:
semiconductor devices located on the substrate; and
metal interconnect structures located within dielectric material layers that overlie the substrate and underlie the dielectric isolation layer, wherein the heater line, the first electrode, and the second electrode are electrically connected to a respective one of the metal interconnect structures.

14. The semiconductor structure of claim 8, further comprising:
a heater-capping dielectric plate contacting a top surface of the heater line and contacting a bottom surface of the middle portion of the PCM line;
a first electrode-capping dielectric plate contacting a second segment of the top surface of the first electrode; and
a second electrode-capping dielectric plate contacting a second segment of the top surface of the second electrode,
wherein the first electrode-capping dielectric plate and the second electrode-capping dielectric plate have a same material composition and a same thickness as the heater-capping dielectric plate.

15. The semiconductor structure of claim 8, further comprising:
a PCM-capping dielectric plate having sidewalls that are vertically coincident with sidewalls of the PCM line;
wherein the heater line laterally extends over the PCM-capping dielectric plate and comprises a middle portion having an areal overlap with the middle portion of the PCM line; and
wherein a lower portion of the heater line is laterally surrounded by the dielectric material layer.

16. A semiconductor structure comprising:
a heater line, a first electrode, and a second electrode that are laterally spaced apart among one another and overlying a substrate;
a heater-capping dielectric plate contacting a top surface of the heater line;
a phase change material (PCM) line comprising a middle portion overlying the heater line, a first end portion contacting a first segment of a top surface of the first electrode, and a second end portion contacting a first segment of a top surface of the second electrode;
a PCM-capping dielectric plate having sidewalls that are vertically coincident with sidewalls of the PCM line;
an additional heater line laterally extending over the PCM-capping dielectric plate and comprising a middle portion having an areal overlap with a middle portion of the heater line; and
a first dielectric material layer laterally surrounding the PCM line and the PCM-capping dielectric plate,
wherein a lower portion of the additional heater line is laterally surrounded by the first dielectric material layer.

17. The semiconductor structure of claim 16, further comprising:
a first electrode-capping dielectric plate contacting a second segment of the top surface of the first electrode; and
a second electrode-capping dielectric plate contacting a second segment of the top surface of the second electrode,
wherein the first electrode-capping dielectric plate and the second electrode-capping dielectric plate have a same material composition and a same thickness as the heater-capping dielectric plate.

18. The semiconductor structure of claim 17, wherein the PCM line contacts:
a sidewall of the first electrode-capping dielectric plate;
a sidewall of the second electrode-capping dielectric plate;
a segment of a top surface of the first electrode-capping dielectric plate; and
a segment of a top surface of the second electrode-capping dielectric plate.

19. The semiconductor structure of claim 16, further comprising:
a dielectric isolation layer overlying the substrate and comprising a planar top surface, wherein the heater line, the first electrode, and the second electrode are located on the planar top surface; and
a dielectric encapsulation layer contacting all sidewalls of the phase change material line and overlying an entirety of a top surface of the phase change material line.

20. The semiconductor structure of claim 16, further comprising:
a dielectric material layer overlying the first dielectric material layer and laterally surrounding the additional heater line;
a first electrode contact via structure vertically extending through the dielectric material layer and the first dielectric material layer and contacting the top surface of the first electrode;
a second electrode contact via structure vertically extending through the dielectric material layer and the first dielectric material layer and contacting the top surface of the second electrode;
a first heater contact via structure vertically extending through the dielectric material layer and contacting a top surface of a first end portion of the additional heater line; and
a second heater contact via structure vertically extending through the dielectric material layer and contacting a top surface of a second end portion of the additional heater line.

* * * * *